United States Patent
Ehsan et al.

(10) Patent No.: US 12,421,614 B2
(45) Date of Patent: Sep. 23, 2025

(54) AEROSOL-ASSISTED CHEMICAL VAPOR DEPOSITION OF NICKEL SULFIDE NANOWIRES FOR ELECTROCHEMICAL WATER OXIDATION

(71) Applicant: KING FAHD UNIVERSITY OF PETROLEUM AND MINERALS, Dhahran (SA)

(72) Inventors: Muhammad Ali Ehsan, Dhahran (SA); Abbas Saeed Hakeem, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 611 days.

(21) Appl. No.: 17/844,439

(22) Filed: Jun. 20, 2022

(65) Prior Publication Data

US 2023/0407497 A1   Dec. 21, 2023

(51) Int. Cl.
C25B 11/052    (2021.01)
C23C 16/30    (2006.01)
(Continued)

(52) U.S. Cl.
CPC .......... C25B 11/052 (2021.01); C23C 16/305 (2013.01); C23C 16/4486 (2013.01);
(Continued)

(58) Field of Classification Search
CPC ....... C25B 11/052; C25B 1/04; C25B 11/031; C25B 11/054; C25B 11/061;
(Continued)

(56) References Cited

U.S. PATENT DOCUMENTS

2023/0061774 A1*  3/2023  Kaliaperumal ....... H01M 4/923

FOREIGN PATENT DOCUMENTS

CN    108714427 A    10/2018
CN    108823597 A  * 11/2018 ............. B01J 27/24
(Continued)

OTHER PUBLICATIONS

O'Brien et al. ("Deposition of Ni and Pd Sulfide Thin Films via Aerosol-Assisted CVD," Chem. Vap. Deposition 2006, 12, 620-626) (Year: 2006).*

(Continued)

*Primary Examiner* — James Lin
*Assistant Examiner* — Kevin Sylvester
(74) *Attorney, Agent, or Firm* — Oblon, McClelland, Maier &Neustadt, L.L.P.

(57) ABSTRACT

An aerosol-assisted chemical vapor-deposition (AACVD) method of making nickel sulfide (NiS) nanowires. The method includes depositing a nickel carbamate compound onto a conductive support by an AACVD technique to form nickel sulfide (NiS) nanowires on the conductive support, where the nanowires are present directly on a surface of the conductive support. The NiS electrode prepared by the process of the present disclosure showed excellent OER activity in 1.0 M KOH solution, with a low Tafel value (60 mV dec$^{-1}$) and good OER stability. The NiS nanowires, as prepared, can be used in energy conversion devices such as batteries, fuel cells, and supercapacitors.

17 Claims, 20 Drawing Sheets

(51) Int. Cl.
  *C23C 16/448* (2006.01)
  *C25B 1/04* (2021.01)
  *C25B 11/054* (2021.01)
  *C25B 11/075* (2021.01)
  *C25B 11/031* (2021.01)
  *C25B 11/061* (2021.01)

(52) U.S. Cl.
  CPC .............. *C25B 1/04* (2013.01); *C25B 11/054* (2021.01); *C25B 11/075* (2021.01); *C25B 11/031* (2021.01); *C25B 11/061* (2021.01)

(58) Field of Classification Search
  CPC ..... C25B 11/065; C25B 11/075; C25B 11/02; C23C 16/305; C23C 16/4486; C23C 16/4418
  See application file for complete search history.

(56) References Cited

FOREIGN PATENT DOCUMENTS

| CN | 108517534 | B | | 6/2020 | |
|---|---|---|---|---|---|
| CN | 111266121 | A | * | 6/2020 | ............ B01J 27/043 |
| CN | 113186558 | A | | 7/2021 | |
| CN | 113279012 | A | | 8/2021 | |
| KR | 10-2022-0031386 | | | 3/2022 | |

OTHER PUBLICATIONS

Lee et al. ("Activation of Ni electrocatalyst through spontaneous transformation of nickel sulfide to nickel hydroxide in an oxygen evolution reaction," Appl. Catal., B 2018, 233, 130-135) (Year: 2018).*

Ali et al. ("A thermal analysis of dialkyldithiocarbamato nickel(II) and copper(II) complexes," Thermochim. Acta. 2004, 419, 39-43) (Year: 2004).*

Muhammad Ali Ehsan et al. ("Aerosol-assisted chemical vapor deposition of nickel sulfide nanowires for electrochemical water oxidation," Int. J. Hydrogen Energy 2022, 47, 42001-12) (Year: 2022).*

Waters et al. ("A Single Source Approach to Deposition of Nickel and Palladium Sulfide Thin Films by LP-MOCVD," Mat. Res. Soc. Symp. Proc. 2003, 744, p. M5.16.1-6) (Year: 2003).*

Mgabi et al. "Deposition of cobalt and nickel sulfide thin films from thio- and alkylthiourea complexes as precursors via aerosol assisted chemical vapor deposition technique," Thin Solid Films 2014, 564, 51-57. (Year: 2014).*

Guo et al. "Synthesis of lawn-like $NiS_2$ nanowires on carbon fiber paper as bifunctional electrode," Int. J. Hydrogen Energy 2017, 17038-17048. (Year: 2017).*

Li et al. "Tuning crystal phase of $NiS_x$ through electro-oxidized nickel foam: A novel route for preparing efficient electrocatalysts for oxygen evolution reaction," Appl. Surf. Sci. 2017, 396, 1034-1043. (Year: 2017).*

Manjunata et al. "Controlled synthesis of nickel sulfide polymorphs: studies on the effect of morphology and crystal structure on OER performance," Materials Today Energy 2020, 16, article 100414, p. 1-10. (Year: 2020).*

Ehsan et al. "Highly Effective Electrochemical Water Oxidation by Millerite-Phased Nickel Sulfide Nanoflakes Fabricated on Ni Foam by Aerosol-Assisted Chemical Vapor Deposition," Energy Fuel 2021, 35, 16054-16064. (Year: 2021).*

Ehsan, et al. ; Highly Effective Electrochemical Water Oxidation by Millerite-Phased Nickel Sulfide Nanoflakes Fabricated on Ni Foam by Aerosol-Assisted Chemical Vapor Deposition ; Energy Fuels, 35, 19 ; pp. 16054-16064 ; Sep. 29, 2021 ; Abstract Only ; 4 Pages.

Bolin Li, et al. ; One-pot preparation of $Ni_3S_2$@3-D graphene free-standing electrode by simple Q-CVD method for efficient oxygen evolution reaction ; International Journal of Hydrogen Energy, vol. 44, Issue 59 ; pp. 30806-30819 ; Nov. 28, 2019 ; Abstract Only ; 2 Pages.

Majid, et al. ; Analysis of dopant concentration effect on optical and morphological properties of PVD coated Cu-doped $Ni_3S_2$ thin films ; Optik, vol. 187 ; pp. 152-163 ; Jun. 2019 ; Abstract Only ; 2 Pages.

* cited by examiner

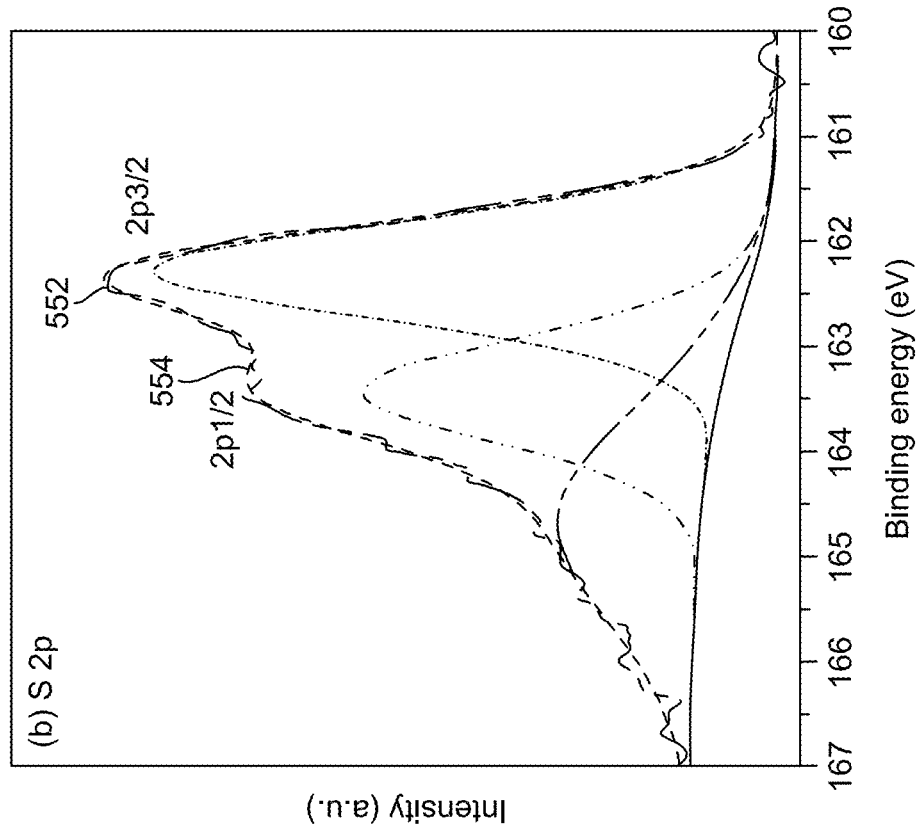
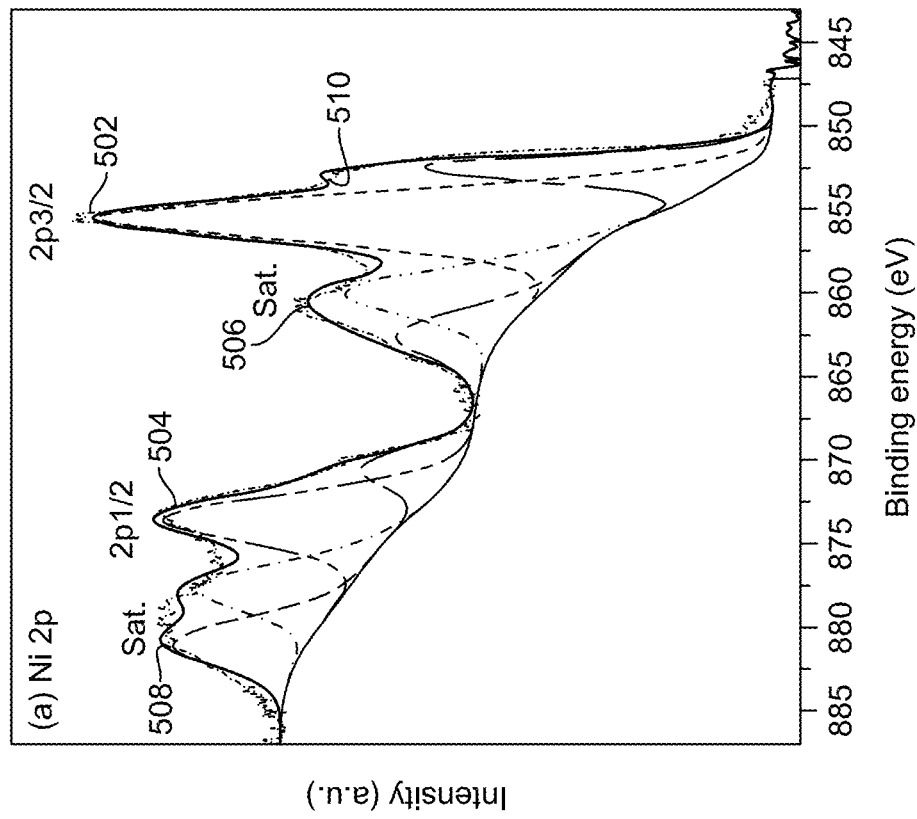
FIG. 5B
FIG. 5A

60μm    Electron image 1

AEROSOL-ASSISTED CHEMICAL VAPOR DEPOSITION OF NICKEL SULFIDE NANOWIRES FOR ELECTROCHEMICAL WATER OXIDATION

STATEMENT OF PRIOR DISCLOSURE BY THE INVENTOR

Aspects of the present disclosure are described in M. Ali Hasan; "Aerosol-assisted chemical vapor deposition of nickel sulfide nanowires for electrochemical water oxidation"; Nov. 19, 2021; International Journal of Hydrogen Energy, incorporated herein by reference in its entirety.

BACKGROUND

Technical Field

The present disclosure is directed to electrocatalysts, and particularly to nickel sulfide (NiS) nanowires formed by aerosol-assisted chemical vapor deposition (AACVD) and the use of the nanowires for electrochemical water oxidation. Methods for preparing the electrocatalysts are included.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

The scarcity of fossil fuels and their impact on environmental pollution have pushed the world to explore green and sustainable energy. Due to its high energy density, hydrogen is considered the most convincing substitute for traditional fossil fuels. In particular, hydrogen as a fuel guarantees zero emission of $CO_2$ and minimizes greenhouse gases to make the earth hygienic, healthy, and green. Currently, hydrogen is primarily extracted from hydrocarbon-based fossil fuels such as coal, oil, and natural gas, which emit a large portion of the $CO_2$ directly into the air. Thus, the hydrogen produced in this way increases the amount of toxic gases in the air and cannot meet ecological sustainability requirements. Alternatively, the hydrogen generated from water electrolysis is a renewable method and has great potential to meet global energy needs over extended periods.

Water dissociation occurs in two half-cell redox steps called the hydrogen evolution reaction (HER) and oxygen evolution reaction (OER). Large-scale water splitting remains a challenge due to the slow kinetics of the OER, which must be intensified with the help of a highly stable and active catalyst to generate high oxygen concentrations through low overpotentials. Conventionally, precious metal oxides such as $RuO_2$ and $IrO_2$ catalyzed OER at low overpotentials; however, their high cost, low bulk, and poor stability limit their use on a commercial scale.

Slow kinetics and emotive design of electrocatalysts are the main barriers to effective oxygen evolution and hydrogen production from water. To overcome these challenges, conventionally, various earth-rich OER electrocatalysts based on transition metals such as metal oxides/hydroxides, perovskites, chalcogenides, carbides, phosphates, and molecular electrocatalysts have been studied intensively. Nickel-based nanomaterials actively participate in energy storage and conversion applications, among other nanomaterials. In particular, nickel sulfide (NiS) in various forms, including $Ni_3S_2$, NiS, and $NiS_2$, has shown potential for OER catalysis. However, its performance is limited by inherent problems such as particle aggregation, limited active sites, and low conductivity. Therefore, there exists a need to develop NiS catalysts with improved OER performance.

Therefore, it is one object of the present disclosure to provide inexpensive, stable, and high-performance OER catalysts for water splitting and methods for making the OER catalysts.

SUMMARY

In an exemplary embodiment, an aerosol-assisted chemical vapor-deposition (AACVD) method of nickel sulfide nanowires for electrochemical water oxidation is described. The method includes aerosol-assisted chemical vapor-depositing a nickel carbamate compound to form nickel sulfide (NiS) nanowires on a conductive support, wherein the nanowires are present directly on a surface of the conductive support.

In some embodiments, the conductive support is a nickel foam, graphene, or a carbon cloth.

In some embodiments, the nickel carbamate is aerosol-assisted chemical vapor-deposited for an interval of from 30 to 120 minutes to form nanowires having a length in a longest dimension of from 10 µm to 100 µm.

In some embodiments, the nickel carbamate is a single source precursor (SSP) for the NiS nanowires.

In some embodiments, the method includes aerosol-assisted chemical vapor-depositing a nickel carbamate onto a conductive support, during which the nickel carbamate decomposes to form nickel (Ni) and sulfur (S) atoms simultaneously.

In some embodiments, the method further includes exposing the NiS nanowires present on the surface of the conductive support to an alkaline aqueous solution to form oxygen and hydrogen.

In some embodiments, the alkaline aqueous solution is potassium hydroxide (KOH).

In some embodiments, the S atoms present on the surface of the conductive support generate an oxidized $Ni(OH)_2$ NiOOH intermediate to promote water oxidation.

In some embodiments, the NiS has a microstructure directly on the surface of the conductive support. The microstructure includes a nanocrystalline morphology that protrudes across the surface of the conductive support.

In some embodiments, the conductive support has a length of at least 1 cm and a width of at least 2 cm.

In an exemplary embodiment, a NiS catalyst obtained by the AACVD method is described. The method includes aerosol-assisted chemical vapor-depositing the nickel carbamate compound onto the conductive support to form the NiS nanowires on the conductive support, where the nanowires are present directly on the surface of the conductive support.

In some embodiments, the conductive support is a nickel foam, graphene, or a carbon cloth.

In some embodiments, the catalyst is formed by aerosol-assisted chemical vapor-depositing the nickel carbamate for an interval of from 30 to 120 minutes In some embodiments, a surface of the catalyst exhibits spike and thorn-like microstructures.

In some embodiments, the NiS catalyst has a microstructure directly on the surface of the conductive support, wherein the microstructure comprises a nanocrystalline morphology that protrudes across the surface of the conductive support.

In some embodiments, the microstructure has a nanocrystalline morphology that protrudes across the surface of the conductive support.

In some embodiments, the nanocrystalline morphology exhibits a uniform fur-rug shaped pattern.

The foregoing general description of the illustrative present disclosure and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIG. 5A shows high-resolution X-ray photoelectron spectroscopy (XPS) spectra Ni 2 p spectrum of the NiS-90 sample, according to certain embodiments;

FIG. 5B shows high-resolution XPS spectra of the S 2 p spectrum of the NiS-90 sample, according to certain embodiments;

DETAILED DESCRIPTION

Figure 1:
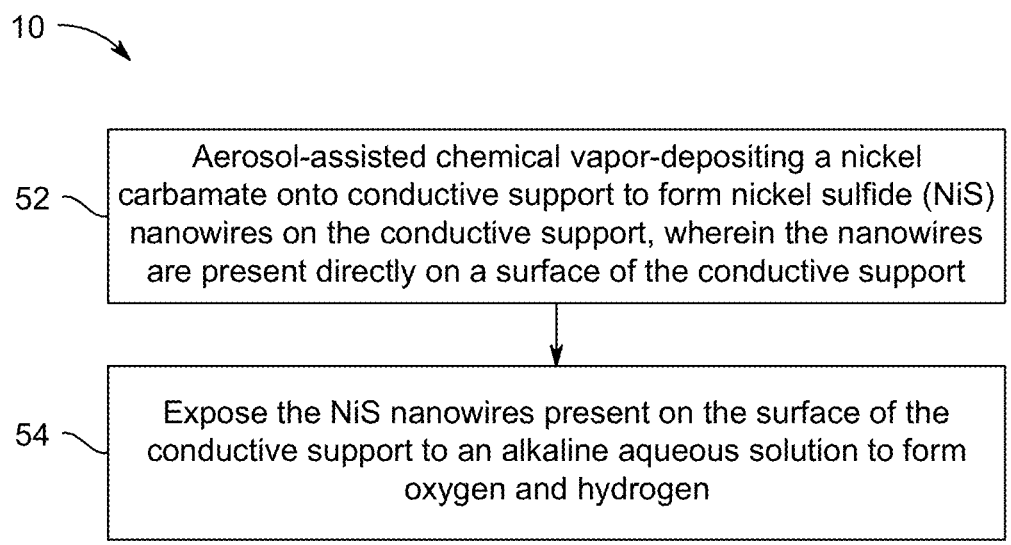
FIG. 1 is a flow chart depicting an aerosol-assisted chemical vapor-deposition (AACVD) method for making nickel sulfide (NiS) nanowires, according to certain embodiments.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values there between.

The present disclosure includes all hydration states of a given compound or formula, unless otherwise noted or when heating a material.

Aspects of the present disclosure are directed to an aerosol-assisted chemical vapor-deposition (AACVD) method of nickel sulfide nanowires for electrochemical water oxidation. Aspects of the present disclosure are also directed to aerosol-assisted chemical vapor-depositing a nickel carbamate compound onto a conductive support. In some embodiments, the depositing a nickel carbamate compound onto a conductive support forms nickel sulfide (NiS) nanowires on the conductive support. Aspects of the present disclosure are also directed to the nanowires being present directly on a surface of the conductive support. Further aspects of the present disclosure are directed to the NiS catalyst produced by the method.

In some embodiments, an aerosol-assisted chemical vapor-deposition (AACVD) method, comprises aerosol-assisted chemical vapor-depositing a nickel carbamate compound to form nickel sulfide (NiS) nanowires on a conductive support. In some embodiments, the nanowires are present directly on a surface of the conductive support. Referring to FIGS. 3E-3H, the NiS deposits are shown to have a wire-like consistency with well-defined linearity in every direction ranging over the area of the nickel foam surface. The nickel foam substrate can be described as a low density, porous structure of cells and continuous ligaments offering a high surface area to volume ratio, and also a high strength to weight ratio. In some embodiments, low density nickel foam refers to a nickel foam with density ranging from 0.3 g/cm$^3$ to 0.7 g/cm$^3$, preferably 0.35 g/cm$^3$ to 0.65 g/cm$^3$, preferably 0.4 g/cm$^3$ to 0.6 g/cm$^3$, preferably 0.45 g/cm$^3$ to 0.55 g/cm$^3$, or g/cm$^3$. In some embodiments, porous nickel foam refers to a nickel foam with a porosity ranging from 85% to 95%, preferably 86% to 94%, preferably 87% to 93%, preferably 88% to 92%, preferably 89% to 91%, or 90%. The cell structure of the nickel foam can be described as open-cell, meaning it has small cells that are not completely sealed and allow air to fill the space or take on water if soaked, and can be easily compressed and then naturally recover back to its original shape. The ligaments of the nickel foam refers to skeleton or framework of the nickel foam material, or the ligaments refer to areas in the nickel foam with no voids or pores. In some embodiments, the high surface area to volume ratio of the nickel foam ligaments ranges from 1000:1 to 5000:1, preferably 1500:1 to 4500:1, preferably 2000:1 to 4000:1, preferably 2500:1 to 3500:1, or 3000:1. In some embodiments, the nickel foam has a strength to weight ratio ranging from 100:1 to 500:1, preferably 150:1 to 450:1, preferably 200:1 to 400:1, preferably 250:1 to 350:1, or 300:1. The nickel foam has aNiS nanowires growing directly on the nickel foam can be defined by the direct connection between the formed nanowires to the nickel foam itself, without any space between them. For this purpose, the NiS nanowires were grown on the NF for short intervals of 30, 60, 90, and 120 minutes through an aerosol-assisted chemical vapor deposition (AACVD) process using nickel diethyldithiocarbamate as a precursor. In certain embodiments, the NiS nanowires were grown on NF supports for intervals of 40, 70, 100, or 130 minutes, or 20, 50, 80, or 110 minutes. The AACVD method can be defined by atomising the solution of the chemical precursors into liquid droplets (the aerosol) instead of relying, as in conventional CVD, on evaporation when the carrier gas passes through the liquid in a heated bubbler. One or more additional chemical precursors can be used such as palladium acetylacetonate, iron acetylacetonate, platinum acetylacetonate, tantalum acetylacetonate, and copper acetylacetonate. Their efficiency as OER catalysts was investigated in a 1.0 M KOH solution. One or more additional bases can be used for the OER investigation such as LiOH, NaOH, RbOH, CsOH, Ca(OH)$_2$, Sr(OH)$_2$, and Ba(OH)$_2$. The results indicate the NiS electrode produced after 90 minutes showed remarkable OER performance at an overpotential ($\eta$) of 210 mV to reach a standard current density of 10 mA cm$^{-2}$. A higher current density of 500 mA cm$^{-2}$ is achieved at an overpotential of 340 mV. Further, the electrocatalyst has a low Tafel value (60 mV dec$^{-1}$) and good OER stability. The facile synthesis of NiS nanowire films by AACVD tends to be used as an anodic material in various other power generation and energy conversion devices such as batteries, fuel cells, and supercapacitors.

The present disclosure also provides a method 10 of making the nickel sulfide (NiS) nanowires, which forms a thin layer or film, via an AACVD technique for electrochemical water oxidation. Referring to FIG. 1, a schematic flow diagram of a method of making the NiS nanowires for electrochemical water oxidation is illustrated. The order in which the method is described is not intended to be construed as a limitation, and any number of the described method steps can be combined in any order to implement the method. Additionally, individual steps may be removed or skipped from the method without departing from the spirit and scope of the present disclosure.

At step 52, the method 10 includes aerosol-assisted chemical vapor-depositing (AACVD) a nickel carbamate (compound) onto a conductive support to form NiS nanowires on the conductive support. The conductive support can be described as a material, base, or structure that can conduct an electric charge or heat. The straightforward development of catalytic thin film (NiS thin films) onto the substrate surface AACVD technique is highly beneficial in reducing the overpotential and increasing the OER performance. Also, this method evades the need for binders and conducting agents, which makes the synthesis process simple, fast, and cost-reductive. In an embodiment, the synthesis of the catalytic thin film was carried out at about 400° C. for 30-120 minutes, preferably 60 minutes, or most preferably 90 minutes. In some embodiments, the nanowires have a length of 10 µm to 100 µm in the longest dimension, preferably 20 µm to 90 µm, preferably 30 µm to 80 µm, preferably 40 µm to 70 µm, preferably 50 µm to 60 µm, or 55 µm. During the AACVD process, the nickel carbamate compound decomposes to form nickel (Ni) and sulfur (S) atoms simultaneously during to AACVD process. The simultaneous decomposition can be described as an instantaneous reaction where the Ni and S atoms separate in a nano second time frame. The S atoms present on the surface of the conductive support generate an oxidized Ni(OH)$_2$NiOOH intermediate to promote water oxidation.

The NiS nanowires are present directly on a surface of the conductive support. The conductive support is a nickel foam, graphene, or a carbon cloth. One or more additional metal foams or derivatives can be used as the conductive support such as cooper foam, iron foam, magnesium foam, zinc foam, gold foam, tantalum foam, lead foam, brass foam, silver foam, silver-copper foam, metallic glasses, shape-memory alloys, and martensitic alloys. In a preferred embodiment, the conductive support is the nickel foam. In an embodiment, the conductive support has a length of at least 1 cm, preferably at least 1.1 cm, preferably at least 1.2 cm, preferably at least 1.3 cm, preferably at least 1.4 cm, preferably at least 1.5 cm, preferably at least 1.6 cm, or 1.75 cm and a width of at least 2 cm, preferably at least 2.1 cm, preferably at least 2.2 cm, preferably at least 2.3 cm, preferably at least 2.4 cm, preferably at least 2.5 cm, preferably at least 2.6 cm, or 2.75 cm.

Figure 3A:
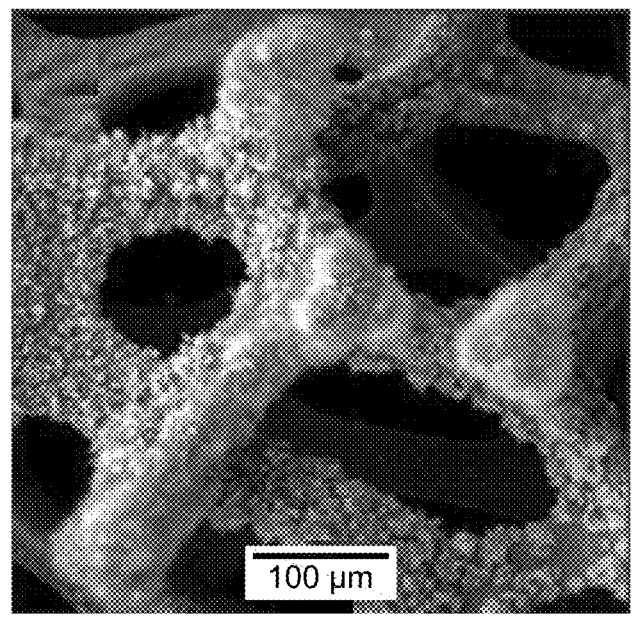
FIG. 3A depicts a low magnification (1.0 Kx) field emission scanning electron microscope (FESEM) image of NiS deposits on a nickel foam (NF) substrate after 30 minutes, according to certain embodiments.
Figure 3B:
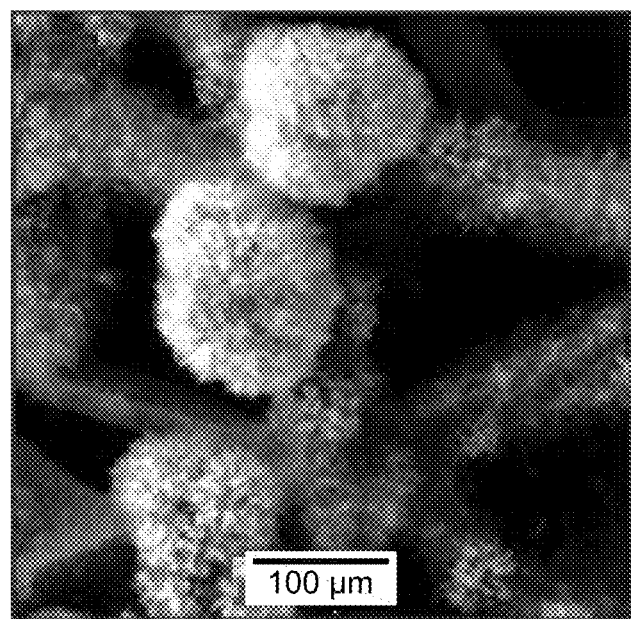
FIG. 3B depicts a low magnification (1.0 Kx) FESEM of NiS deposits on a nickel foam (NF) substrate after 60 minutes, according to certain embodiments.
Figure 3C:
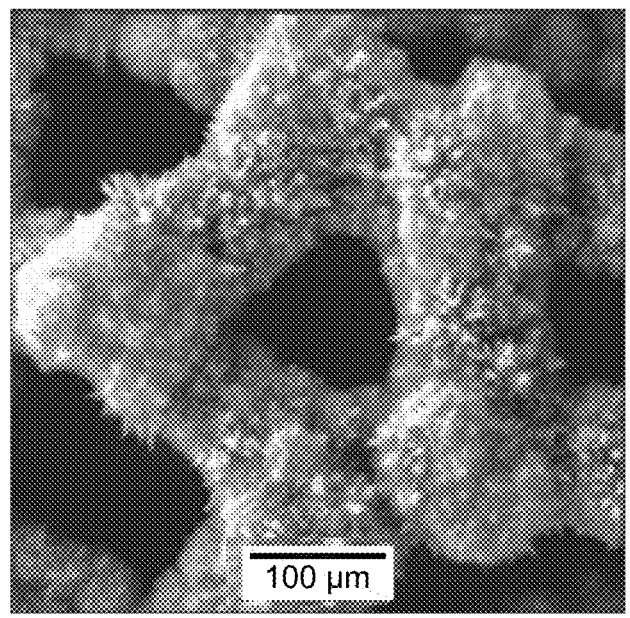
FIG. 3C depicts a low magnification (1.0 Kx) FESEM of NiS deposits on a nickel foam (NF) substrate after 90 minutes, according to certain embodiments.
Figure 3D:
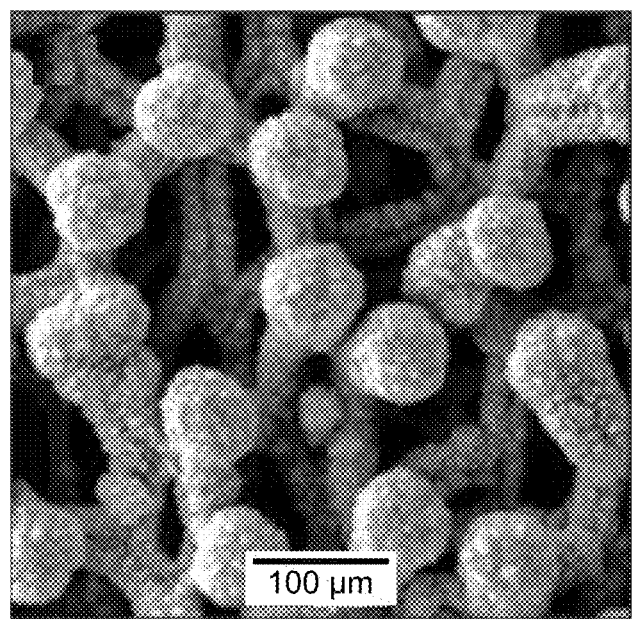
FIG. 3D depicts a low magnification (1.0 Kx) FESEM of NiS deposits on a nickel foam (NF) substrate after 120 minutes, according to certain embodiments.
Figure 3E:
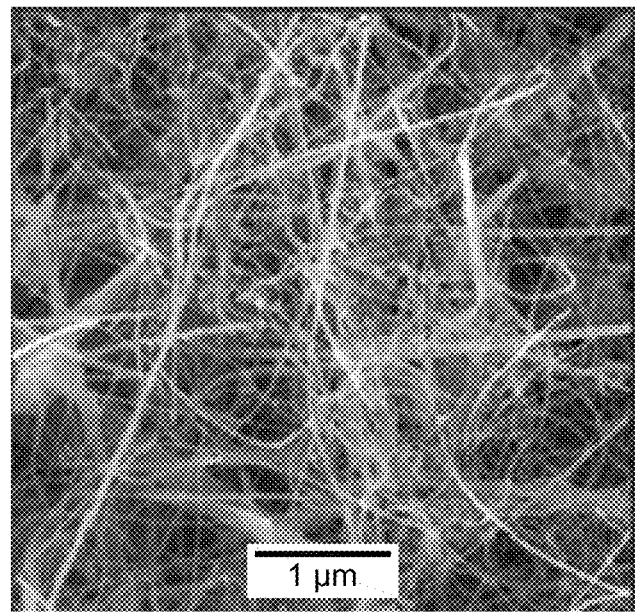
FIG. 3E depicts a high magnification (50.0 Kx) FESEM of NiS deposits on a nickel foam (NF) substrate after 30 minutes, according to certain embodiments.
Figure 3F:
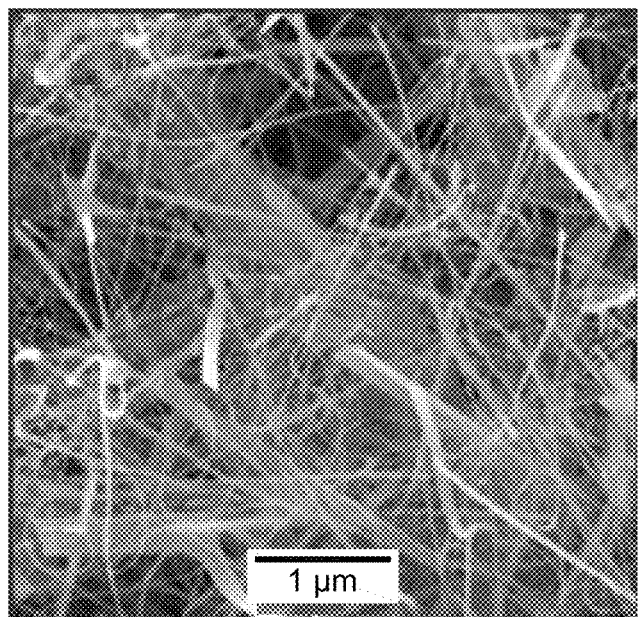
FIG. 3F depicts a high magnification (50.0 Kx) FESEM of NiS deposits on a nickel foam (NF) substrate after 60 minutes, according to certain embodiments.
Figure 3G:
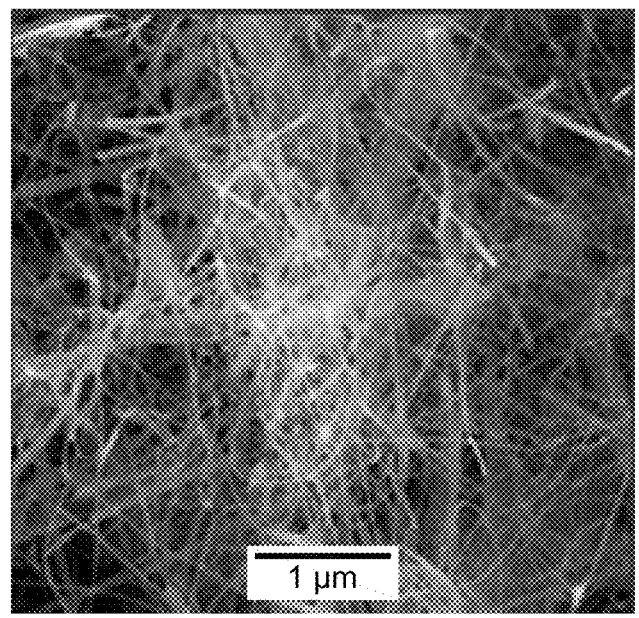
FIG. 3G depicts a high magnification (50.0 Kx) FESEM of NiS deposits on a nickel foam (NF) substrate after 90 minutes, according to certain embodiments.

The surface morphology of the synthesized catalytic thin film (catalyst) was examined by analytical techniques. The NiS has a microstructure directly on the surface of the conductive support, without any space or void between the microstructure and support. Referring to FIGS. 3A and 3B, the puffy and ball-like microstructure is shown to grow directly on the hexagonal lattice of the conductive support. The microstructure includes a nanocrystalline morphology that protrudes across the surface of the conductive support. Referring to FIG. 3C, the microstructure grown directly on the conductive support has little crystal spikes protruding from the hexagonal lattice with clusters of nanocrystals covering the entire geography of the conductive support lattice. In some embodiments, the crystal spikes have a length of 10 µm to 100 µm in the longest dimension, preferably 20 µm to 90 µm, preferably 30 µm to 80 µm, preferably 40 µm to 70 µm, preferably 50 µm to 60 µm, or 55 µm. In an embodiment, the nanocrystalline morphology exhibits a uniform fur-rug shaped pattern. Referring to FIG. 3D, a surface of the catalyst shows spike and thorn-like microstructures, but in a smooth, longitudinal fashion across the catalyst, drawing comparisons to the uniform fur-rug shape described above. In some embodiments, the spikes or thorns have a length in the longest dimension of 20 µm to 200 µm in the longest dimension, preferably 40 µm to 180 µm, preferably 60 µm to 160 µm, preferably 80 µm to 140 µm, preferably 100 µm to 140 µm, or 120 µm.

At step 54, the method 10 includes exposing the NiS nanowires present on the surface of the conductive support to an alkaline aqueous solution to form oxygen and hydrogen. In an embodiment, the alkaline aqueous solution is potassium hydroxide (KOH). One of more alkaline solutions can be substituted, such as ammonia, ammonium hydroxide, calcium hydroxide, calcium oxide, potassium carbonate, sodium carbonate, sodium hydroxide, peroxides, silicates, and tri sodium phosphate. This was performed to evaluate the electrochemical water oxidation performance of the NiS nanowire electrodes. The results indicate the NiS electrode produced after 90 minutes showed remarkable OER performance at an overpotential (η) of 210 mV to reach a standard current density of 10 mA cm$^{-2}$.

A single source precursor can be defined as molecular complexes that contain all of the necessary elements required to make an organic or inorganic product.

EXAMPLES

The following examples describe and demonstrate exemplary embodiments of the aerosol-assisted chemical vapor deposition (AACVD) of nickel sulfide (NiS) nanowires for electrochemical water oxidation. The examples are provided solely for illustration and are not to be construed as limitations of the present disclosure, as many variations thereof are possible without departing from the spirit and scope of the present disclosure.

Experimental

Materials and Reagents

Nickel (II) nitrate hexahydrate [$Ni(NO_3)_2 \cdot 6H_2O$] and sodium diethyldithiocarbamate hydrate $NaS_2CN(C_2H_5)_2) \cdot xH_2O$ from Sigma Aldrich were used as received. Methanol and toluene from Merck chemicals were used to synthesize the nickel diethyldithiocarbamate precursor and fabricate nickel sulfide thin films in the AACVD process.

Example 1: Synthesis of Nickel Diethyldithiocarbamate Precursor

In a typical experiment, 500 milligrams (mg) (2.22 mmol) sodium diethyldithiocarbamate $NaS_2CN(C_2H_5)_2) \cdot xH_2O$ was dissolved in 30 mL methanol, followed by the addition of 321 mg (1.10 mmol) $Ni(NO_3)_2 \cdot 6H_2O$. The green solution thus obtained was stirred at room temperature for 30 minutes. The reaction mixture was filtered, and the filtrate was slowly evaporated until the green crystals of the desired precursor $Ni(S_2CN(C_2H_5))_2$ were obtained in two days. The precursor without initial characterization was used directly in AACVD to produce NiS catalyst.

Example 2: Preparation of NiS Catalyst Thin Films by AACVD

The methanol solution of the precursor $Ni(S_2CN(C_2H_5))_2$ served as the feedstock for AACVD. The catalyst synthesis was carried out on a nickel foam (NF) substrate of size (1×2 cm$^2$) at a temperature of 400° C. The mass loading of the catalyst was controlled by changing the deposition time periodically every 30, 60, 90, and 120 minutes. For this, the weight of the NF substrate was measured with a microanalytical balance before and after the deposition experiment. The precursor feed was placed in a two-neck round bottom flask immersed in a water bath of an ultrasonic humidifier equipped with a piezoelectric modulator. The aerosol vapor generated in this setup was injected into the reaction chamber. The aerosol flowed over a pre-heated NF substrate in the reaction chamber (400° C.) and formed the desired NiS deposits. Nitrogen gas (99.99% purity) was used during the entire deposition process at a 110 ml/min flow rate. The black mass was deposited evenly on the NF. The deposition time varied between 30 and 120 min, and the samples obtained were labeled as NiS-30, NiS-60, NiS-90, and NiS-120. After completion of the deposition process, the mass of the catalyst produced was immediately recorded and determined as follows: 0.08 mg cm$^{-2}$ (NiS-30), 0.18 mg cm$^{-2}$ (NiS-60), 0.3 mg cm$^{-2}$ (NiS-90) and 0.45 mg cm$^{-2}$ (NiS-120). The catalyst mass increased with deposition time, indicating the higher growth rates of CVD reactions over long periods.

Example 3: Characterization of NiS Catalysts

The crystal structure of the NiS catalyst was determined by Rigaku CuKα radiation using a benchtop MiniFlex X-ray diffraction (mini-XRD) instrument. The thin film morphologies were examined on a dual-beam field emission scanning electron microscope TESCAN Lyra 3. Elemental detection was performed using Energy Dispersion X-ray (EDX) spectroscopy on EDX, INCA Energy 200, Oxford Instrument. The surface chemistry and oxidation state of the NiS catalyst were examined by X-ray photoelectron spectroscopy (XPS). The Thermos Scientific Escalab 250Xi spectrometer equipped with a monochromatic Al Kα (1486.6 eV) X-ray source with a resolution of 0.5 eV was used.

Example 4: Electrochemical OER Studies

The electrochemical measurements of the NiS electrocatalyst were recorded using Gamry INTERFACE 1010 E Potentiostat. The typical three-electrode cell was constituted; the NiS electrode developed on NF served as a working electrode with a platinum coil and Ag/AgCl as a counter and reference electrode. All electrochemical experiments such as cyclic voltammetry (CV), linear sweep voltammetry (LSCV), and chronopotentiometry (CP) were performed in a 1.0 M KOH solution. For the durability test, chronopotentiometry measurements were carried out at two current values over several hours. The electrochemical impedance spectroscopy (EIS) was performed in the range of 100 kHz to 0.1 Hz at open circuit potential using an amplitude value of mV.

Results and Discussion

Characterization of NiS Catalysts

Figure 2:
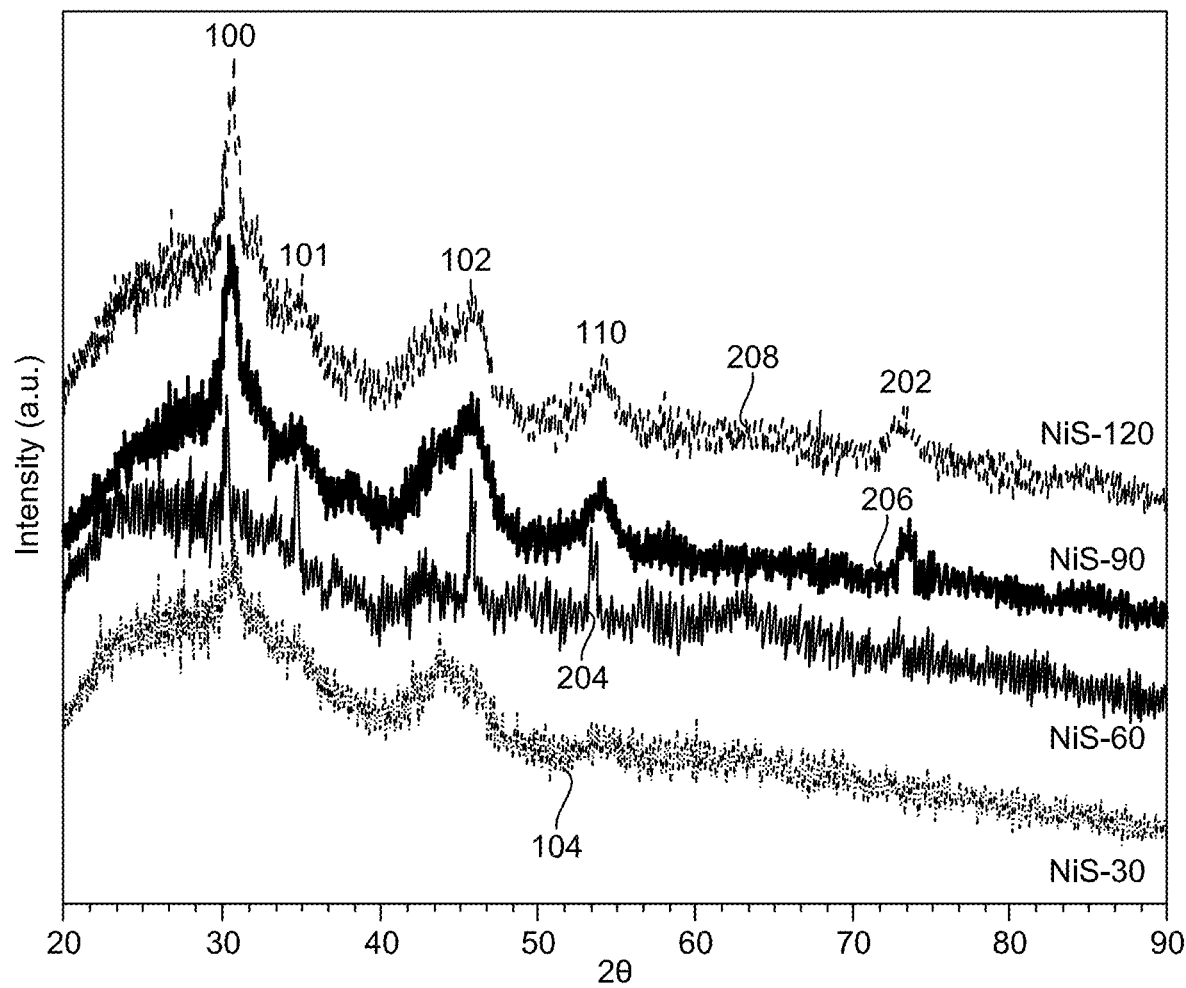
FIG. 2 depicts an X-ray diffractogram (XRD) patterns of various nickel sulfide (NiS) sample deposited via AACVD at different time intervals, according to certain embodiments.

FIG. 2 shows the XRD patterns of as-prepared nickel sulfide (NiS) samples, NiS-30 (104), NiS-60 (204), NiS-90 (206), and NiS-120 (208). In XRD patterns, the characteristic reflections (100), (101), (102), (110), and (202) located at 2θ=30.5°, 35.0°, 46.0°, 53.5°, and 73.4° correspond to the monocrystalline NiS in hexagonal phase (ICSD no. 002-1280). No other impurity peaks such as metallic Ni and NiO were detected in XRD patterns, indicating the successful conversion of nickel diethyldithiocarbamate to pure NiS samples without an additional sulfurization process. Initially, the NiS-30 sample showed two broad XRD peaks at 2θ=30.5° and 46.0°, which became strong and intense as the deposition time increased, and some additional and essential peaks appeared in the NiS-120 sample. The observation suggests that the crystallinity of the sample improves with increasing deposition time.

The NiS microstructures produced on the NF surface by varying deposition times were examined with FESEM, and the corresponding micrographs are shown in FIG. 3. Low-magnification FESEM images, FIGS. 3A-3D reflects the change in growth behavior of the NiS deposits over time. The morphologies were well connected to the NF surface. In the first 30 min, the NF struts received copious amounts of NiS nanocrystallites, and globe-shaped objects grew on the uneven spots of NF (FIG. 3A). This structure grew from the same center to produce thick nanocrystallites and large spherical objects when the time extended to 60 min (FIG. 3B). After 90 min, the NF pores were densely covered with nanocrystalline flakes of NiS, which form a fur-rug-shaped structure, as shown in FIG. 3C. Finally, at 120 min, the NF top skeleton was covered entirely with spherical, berry-like features protruding from the NF surface. The corresponding high-resolution FSEM images of the NiS samples, NiS-30, NiS-60, NiS-90, and NiS-120, can be observed from FIGS. 3E-3H reveals a view of entangled, conglutinated, and disordered nanowires in all the NiS samples.

Figure 3H:
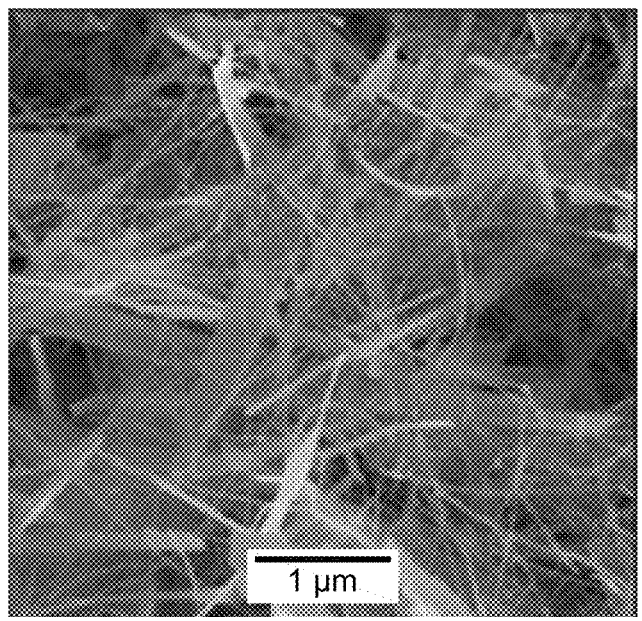
FIG. 3H depicts a high magnification (50.0 Kx) FESEM of NiS deposits on a nickel foam (NF) substrate after 120 minutes, according to certain embodiments.

In AACVD, thin-film NiS microstructures were transformed with increasing calcination/deposition time due to the application of the additional thermal energy. The nanowire structure of the present disclosure remained stable when the calcination periods increased from 30 to 90 minutes, and no significant change was observed in high-resolution FESEM images for the NiS samples NiS-30, Nis-60, and NiS-90, respectively, FIGS. 3E-3G. However, the NiS sample prepared after 120 min (NiS-120) showed some growth of nanoribbons-like features on the upper surface, but the nanowire prints below were also visible (FIG. 3H). The nanowires were stacked to form a three-dimensional (3D) structure, which, compared to other nanostructures, had better conductivity and a higher surface-to-volume ratio. The catalyst comprising such morphological features exhibited improved catalytic activity and prolonged durability in OER catalysis.

Figure 4A:
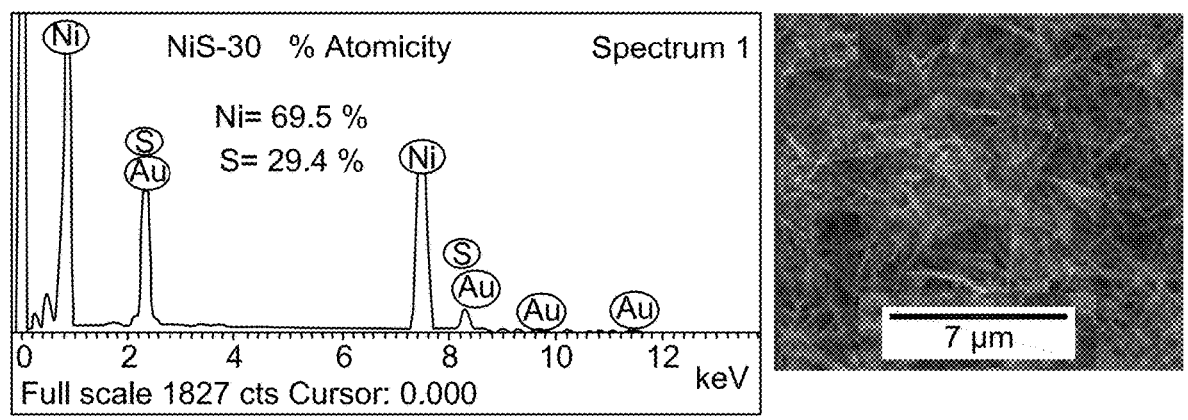
FIG. 4A shows Energy-dispersive X-ray spectroscopy (EDX) spectra of a NiS sample prepared on the NF substrate after 30 minutes, according to certain embodiments.
Figure 4B:
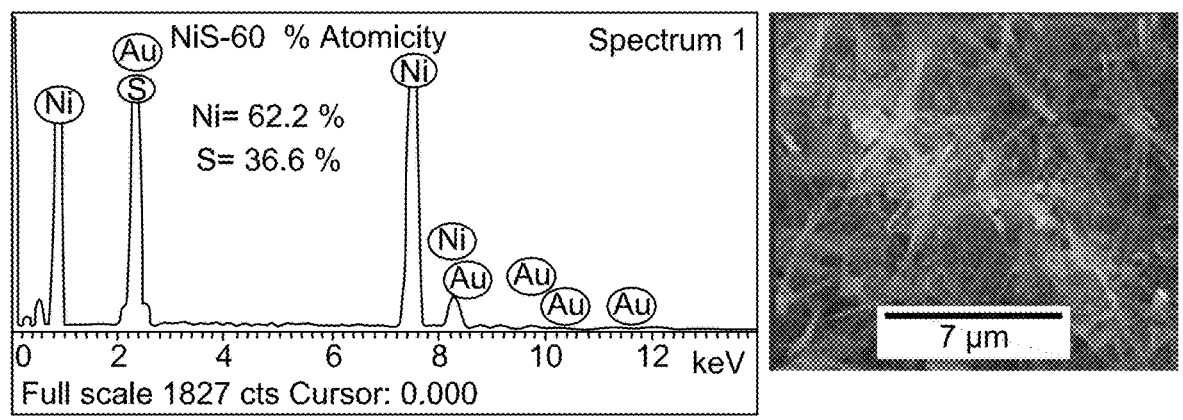
FIG. 4B shows an EDX spectra of a NiS sample prepared on the NF substrate after 60 minutes, according to certain embodiments.
Figure 4C:
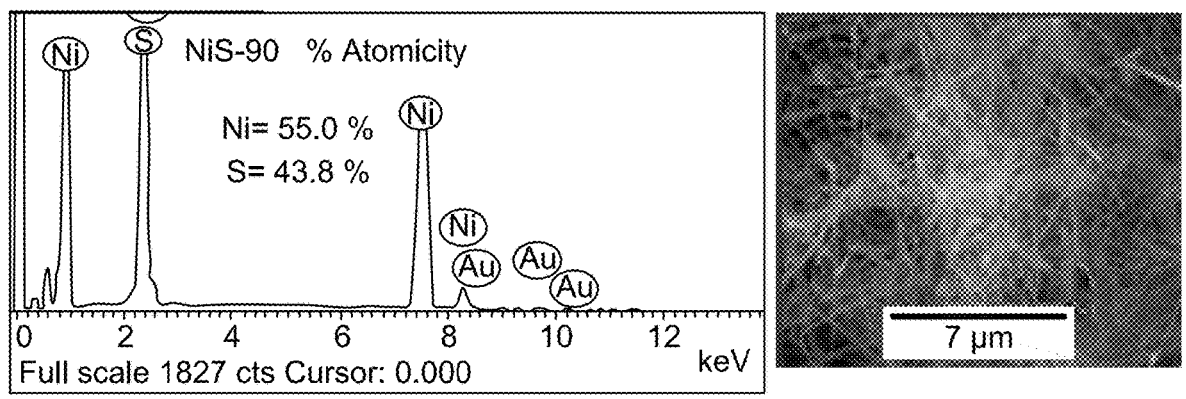
FIG. 4C shows an EDX spectra of a NiS sample prepared on the NF substrate after 90 minutes, according to certain embodiments.
Figure 4D:
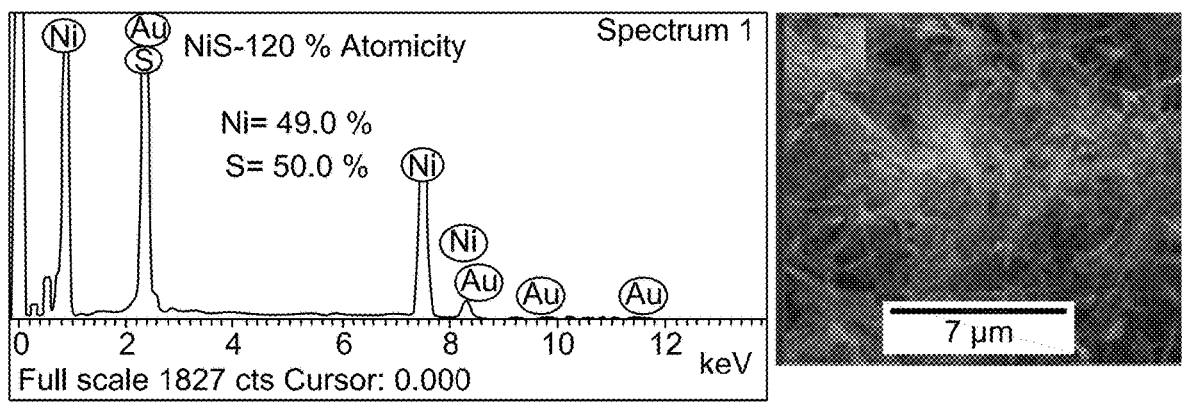
FIG. 4D shows an EDX spectra of a NiS sample prepared on the NF substrate after 120 minutes, according to certain embodiments.

The elemental composition of the NiS samples was verified by energy dispersive X-ray analysis (EDX). FIGS. 4A-4D show the EDX spectra of all the NiS samples with the measured concentrations of Ni and S elements. From the FIG. 4A, it can be observed that the concentration of nickel in the NiS-30 sample was very high compared to S, which is due to the nickel contribution of the NF surface. As the thickness of the NiS deposit increased over time, the contribution of nickel from the NF substrate surface decreased with time. The concentration of Ni in the NiS samples is as follows: NiS-30 (FIG. 4A)>NiS-60 (FIG. 4B)>NiS-90 (FIG. 4C)> and NiS-120 (FIG. 4D). No oxygen was detected in any NiS samples, confirming that it was the only product prepared in all the samples.

XPS analysis was performed on a NiS-90 sample to understand the chemistry of the surface components better. The high-resolution spectra of Ni 2 p and S 2 p are shown in FIGS. 5A and 5B, respectively. The Ni 2 p spectrum (FIG. 5A) shows two spin-orbit doublet peaks for Ni 2 p3/2 (502) and Ni 2p1/2 (504) at 855.4 and 873.4 eV, respectively. The corresponding satellite peaks are observed at 861.3 (506) and 879.5 eV (508), which suggests the presence of $Ni^{2+}$ species. A small shoulder peak at 853.1 eV (510) besides Ni 2 p3/2 (502) corresponds to the characteristic peak for the NiS-90. The S 2p spectrum in FIG. 5B shows a binding energy value of 162.3 eV. The fitting peak at around 162.3 eV belongs to S 2 p3/2 (552), and the peak at 163.5 eV is assigned to S 2 p1/2 (554). These values agree with the literature values. The XPS results conform with the observations from those of the XRD pattern (FIG. 4), thereby confirming the presence of a pure NiS deposit.

Electrochemical Water Oxidation of NiS Nanowires Electrodes

Figure 6A:
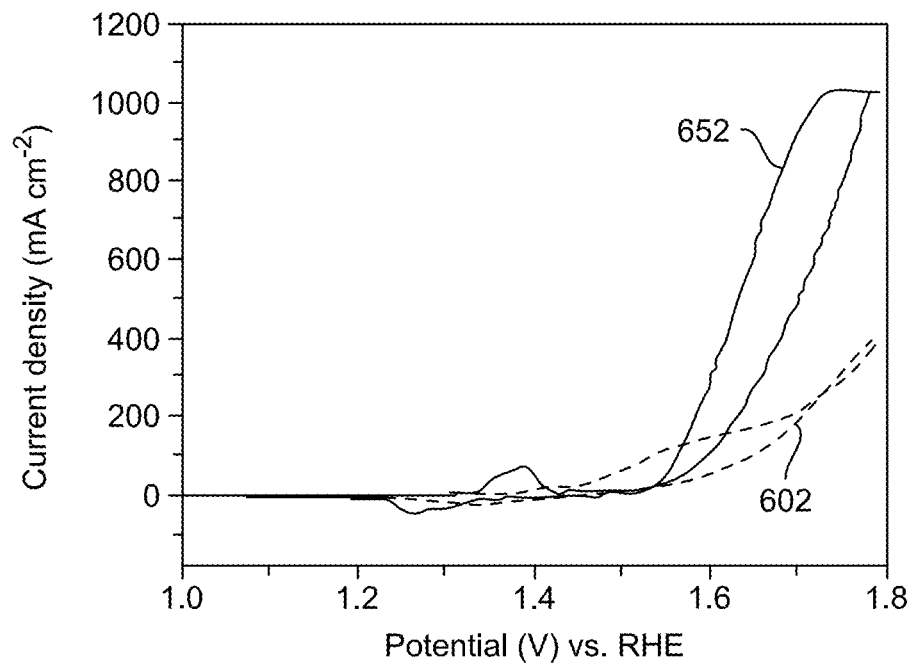
FIG. 6A shows a cyclic voltammetry (CV) scan for a NiS-30 electrode, performed at a scan rate of 50 mV s$^{-1}$, according to certain embodiments.
Figure 6B:
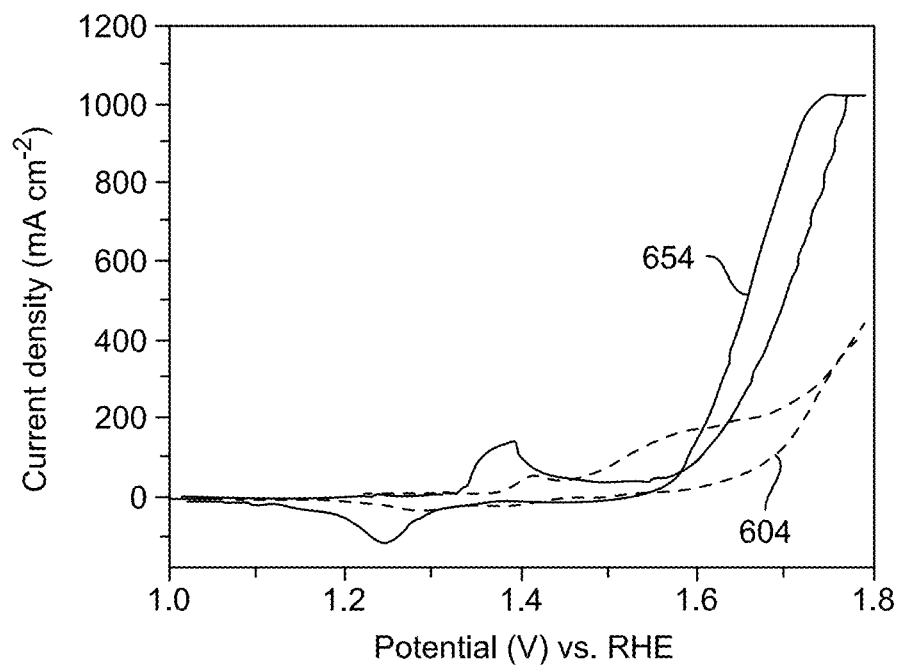
FIG. 6B shows a cyclic voltammetry (CV) scan for a NiS-60 electrode, performed at a scan rate of 50 mV s$^{-1}$, according to certain embodiments.
Figure 6C:
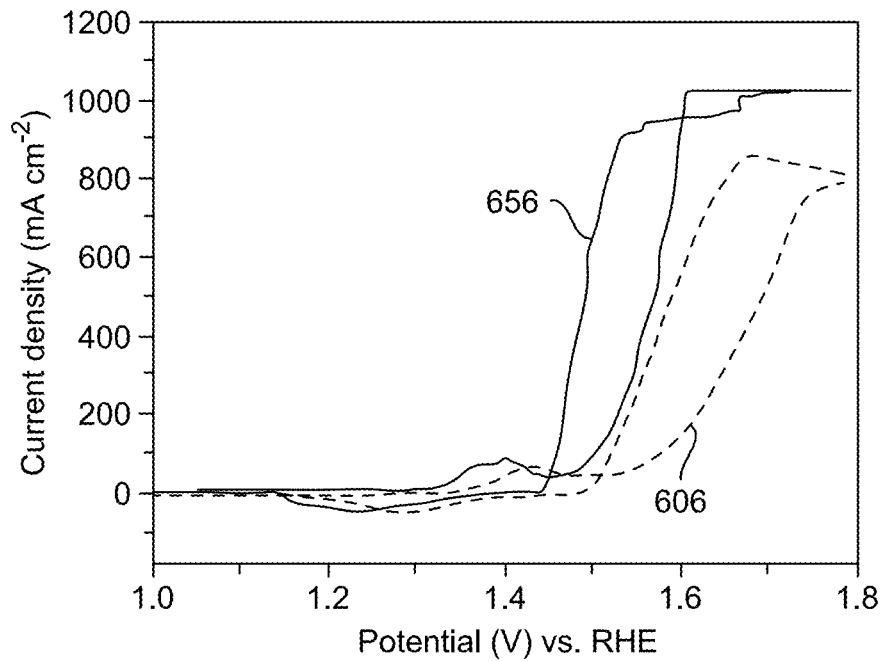
FIG. 6C shows a cyclic voltammetry (CV) scan for a NiS-90 electrode, performed at a scan rate of 50 mV s$^{-1}$, according to certain embodiments.
Figure 6D:
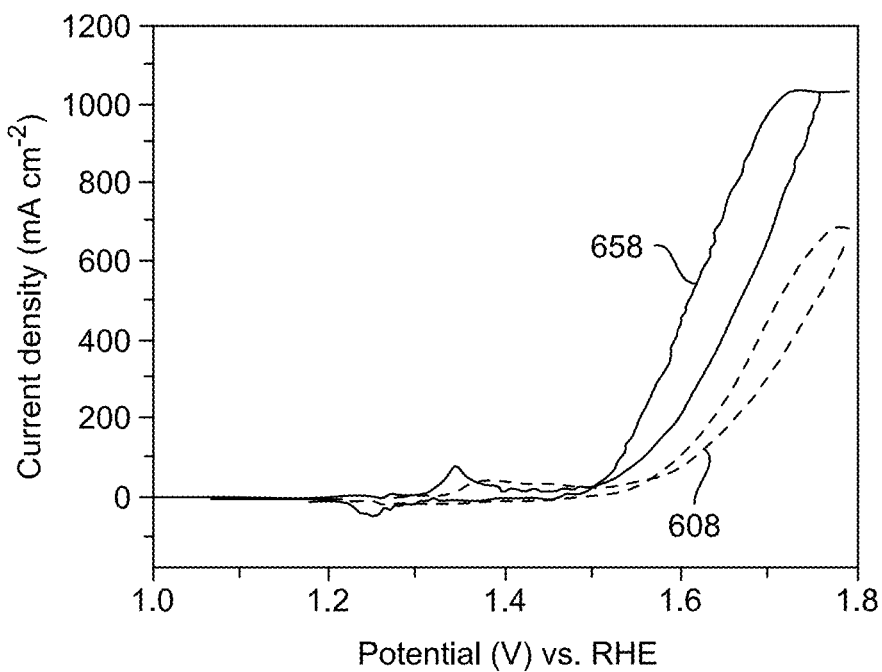
FIG. 6D shows a cyclic voltammetry (CV) scan for a NiS-120 electrode, performed at a scan rate of 50 mV s$^{-1}$, according to certain embodiments.

The catalytic performance of electrodes made from as-synthesized NiS nanowires was examined in an alkaline 1.0 M KOH solution for its electrochemical water oxidation performance. For this purpose, the NiS catalyst electrodes, NiS-30 (FIG. 6A), NiS-60 (FIG. 6B), NiS-90 (FIG. 6C), and NiS-120 (FIG. 6D), were electrochemically activated by performing cyclic voltammetry (CV) in the potential range of 1.0-1.8 V (RHE). Each NiS electrode was scanned for fifty consecutive CV cycles, and the results of the 1st profile (602, 604, 606, and 608) and 50th profile (652, 654, 656, 658) for the samples NiS-30, NiS-60, NiS-90, and NiS-120 are overlaid in FIGS. 6A-6D, respectively. All the catalyst samples showed anodic peaks between 1.3 and 1.5 V (RHE) due to the oxidation of Ni species into Ni (II)/Ni (III) (i.e., $Ni(OH)_2$ to NiOOH). It was observed that the amplitude of the anodic peak increased with each CV cycle, suggesting that the electrochemical oxidation of NiS created more catalytically active spices in the form of NiOOH on the NF surface. The increase in the catalytic sites led to an improvement in the overpotential and the current density of the catalyst. A final current density ~1000 mA $cm^{-2}$ at a potential 1.7 V (vs. RHE) was achieved with each NiS electrode. Remarkably, the NiS-90 electrode (FIG. 6C) exhibited superior activity, and the current density of 1000 mA $cm^{-2}$ was reached even before 1.6 V (vs. RHE). No further current density could be measured because the maximum current sensing capacity of the potentiostat was 1 A.

Figure 7A:
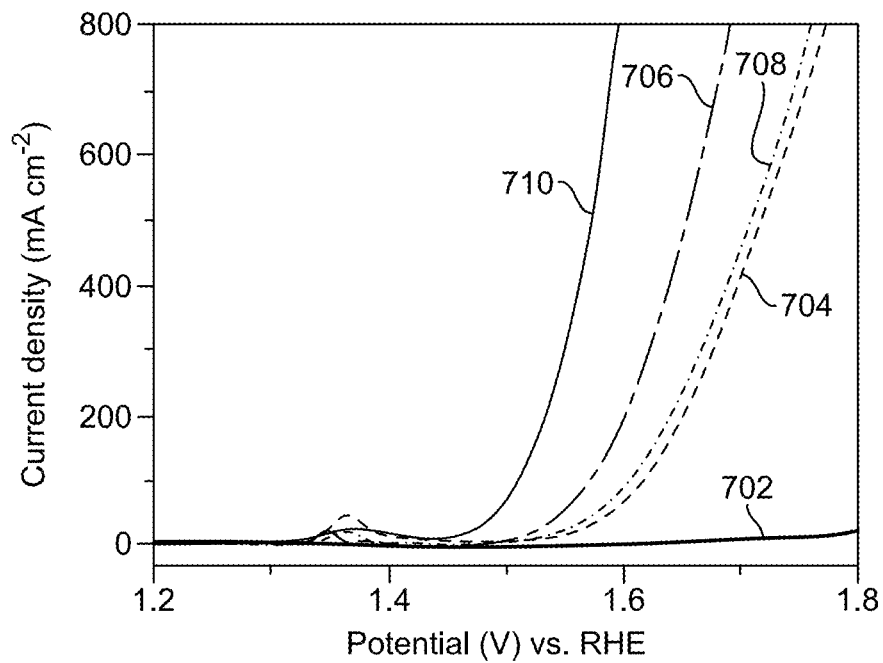
FIG. 7A shows polarization curves for the NiS catalysts obtained at a scan rate of 5 mV$^{-1}$, according to certain embodiments.
Figure 7B:
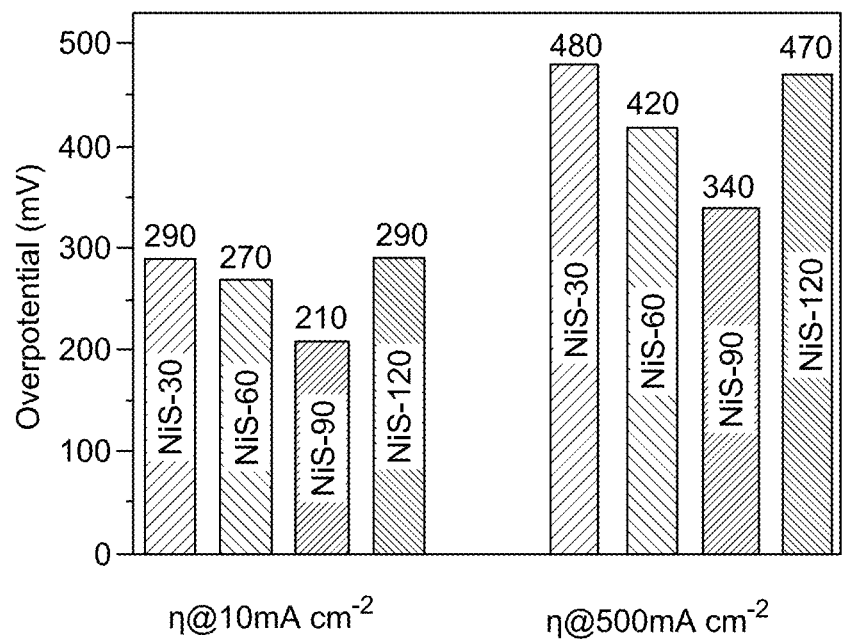
FIG. 7B shows a comparison of overpotential values of the NiS catalyst to reach benchmark current densities of 10 mA cm$^{-2}$ and 500 mA cm$^{-2}$, according to certain embodiments.

FIG. 7A shows the LSV polarization curves of the electrochemically activated NiS electrodes, NiS-30 (702), NiS-60 (704), NiS-90 (706), and NiS-120 (708), and NF (710), which were carried out with a scan rate of 10 mV $s^{-1}$. To confirm the OER catalytic activity, the overpotential (η) of all catalysts at current densities of 10 and 500 mA $cm^{-2}$ were compared (FIG. 7B). The overpotential values for NiS-30, NiS-60, NiS-90, and NiS-120 at η@10 mV cm$^{-2}$ are 290, 270, 210, and 290 mV respectively; and 480, 420, 340 and 470 η@500 mV cm$^{-2}$. It can be seen from the polarization curves (FIG. 7B) that the NiS-90 catalyst outperformed other NiS catalysts by exhibiting the lowest overpotential (η10) of 210 mV. The observed trend for OER activity was as follows: Bare NF (η10 495 mV)<NiS-30 (η10 290 mV)=NiS-120 (η10 290 mV)<NiS-60 (η10 270 mV) and NiS-90 (η10 210 mV). A similar trend was observed when overpotential (η500) values were evaluated, and the NiS-90 catalyst displayed a smallest η500 of 340 mV. It can also be observed that the OER kinetics of NiS-30 and NiS-120 electrodes was almost the same, and their overpotential (η10 and η50) and current densities are almost comparable.

The enhanced OER activity of the electrochemically oxidized NiS-90 catalyst can be attributed to the unique and uniform fur-rug-shaped microstructure shown in FIG. 3C. The catalytic centers appear to be more aligned and unidirectional, which provides a large contact area between the catalyst and reactant species. However, other NiS catalyst surfaces are less uniform, as shown by the microstructure images in FIGS. 3A, 3B, and 3D. Another factor contributing to the improved OER performance of the NiS-90 catalyst could be the optimum mass loading of the catalyst (0.3 mg), which leads to its superior activity.

Figure 7C:
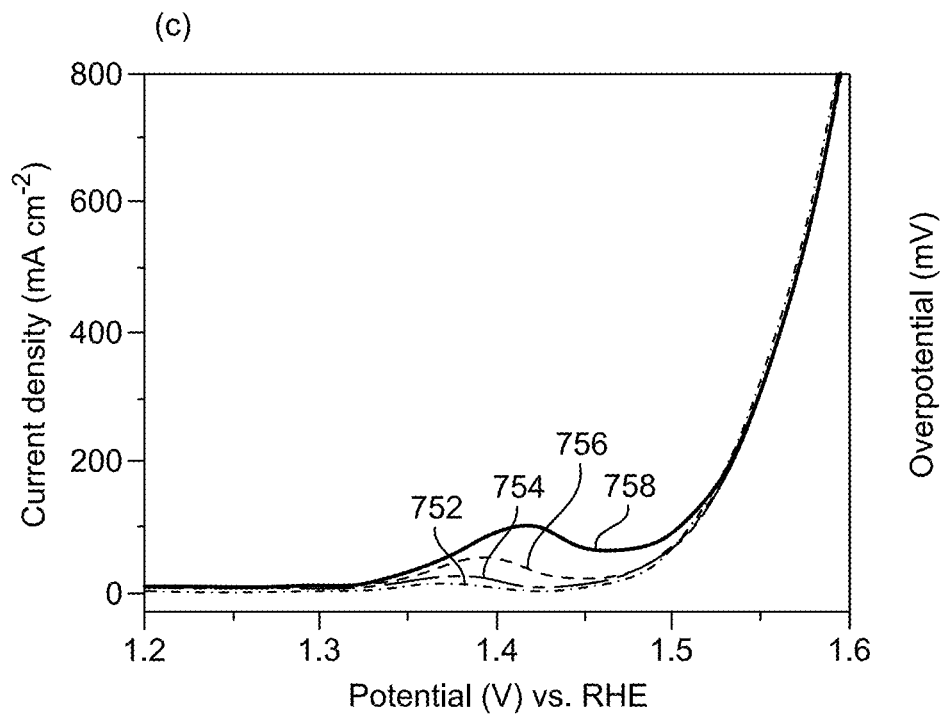
FIG. 7C shows polarization curves of best oxygen evolution reaction (OER) activity of the NiS-90 catalyst recorded at different scan rates of 50, 25 10, and 5 mV s$^{-1}$, according to certain embodiments.
Figure 7D:
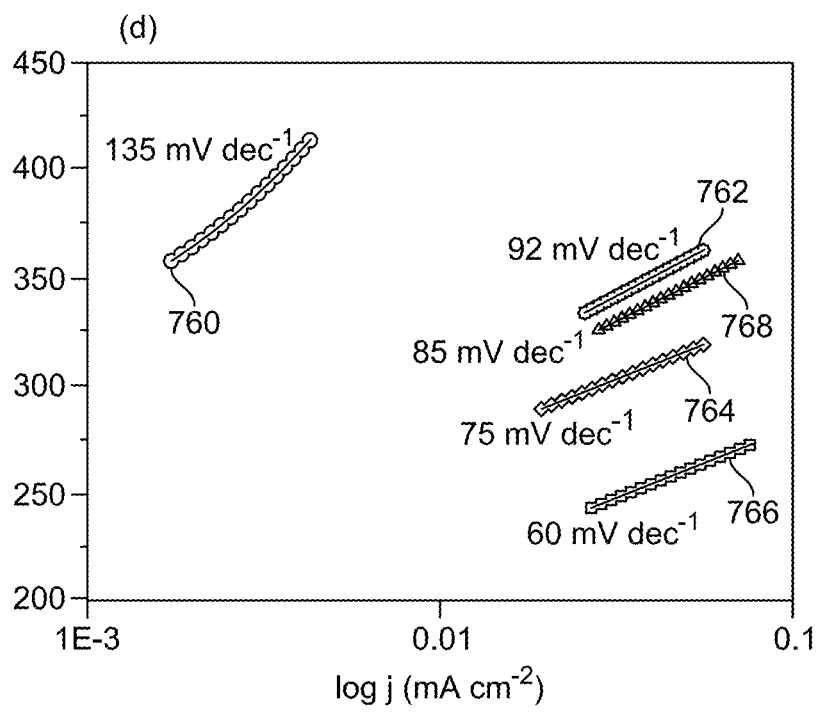
FIG. 7D shows a Tafel plot indicating the OER kinetics for all the NiS catalysts, according to certain embodiments.

FIG. 7C shows the polarization curves recorded at different scan rates, 5 mV/s (752), 10 mV/s (754), 25 mV/s (756), and 50 mV/s (758) for the best performing NiS-90 catalyst and no apparent change in current density was identified at different scan rates. Tafel plots for all catalysts were made to study the OER kinetics. FIG. 7D shows the Tafel plots obtained by fitting the linear parts of the polarization curves. Tafel slope values for bare NF (760), NiS-30 (762), NiS-60 (764), NiS-90 (766), and NiS-120 (768) were measured to be 92, 85, 75, and 60 mV dec-1, respectively. The NiS-90 electrode had the lowest Tafel slope value (60 mV dec-1), suggesting faster OER reaction kinetics, probably due to its uniform microstructure and optimal catalyst mass loading. In addition, the Tafel value of NiS-30 is close to that of NiS-120, suggesting similar pathways and rate-determining steps for these electrodes in a similar alkaline environment.

Figure 8:
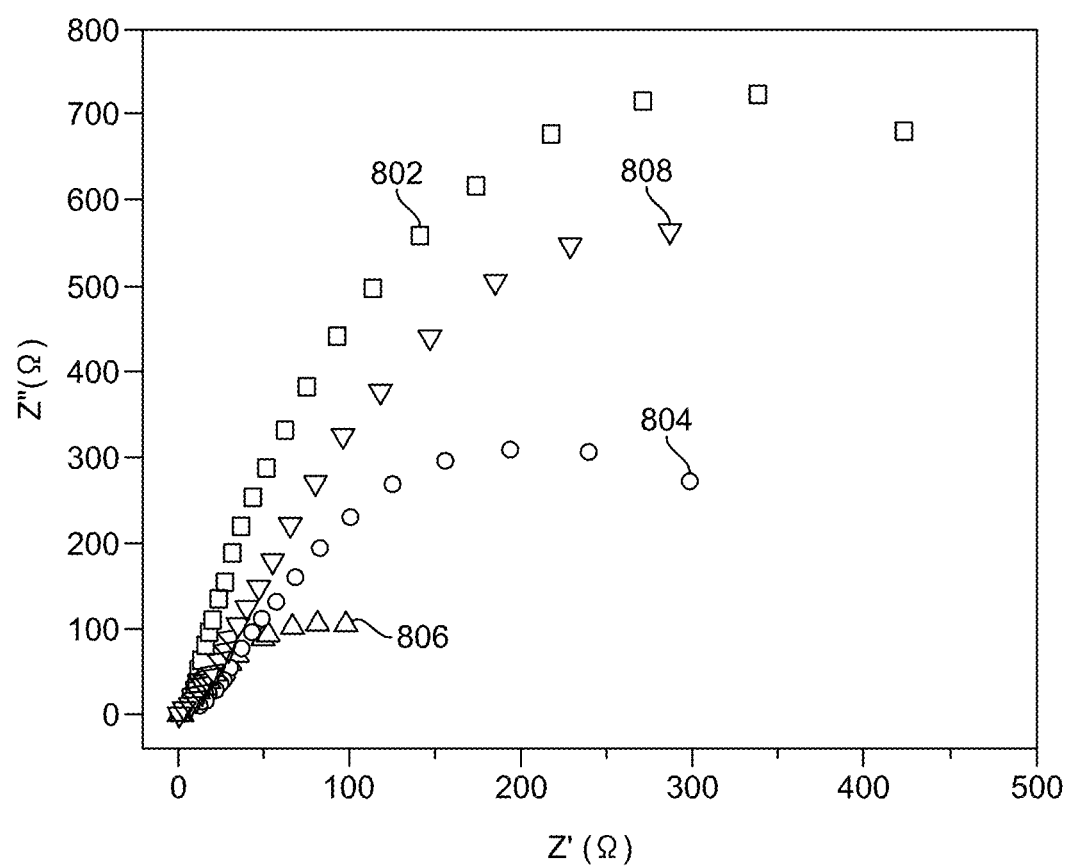
FIG. 8 shows electrochemical impedance spectroscopy (EIS) Nyquist plots recorded in a 1.0 M of KOH solution for the NiS-30, NiS-60, NiS-90, and NiS-120 electrocatalysts loaded on the NF substrate, according to certain embodiments.

The solution resistance is expected to be present during the measurement of electrocatalysts' OER activity, and the electrocatalyst with low charge transfer resistance shows high electrocatalytic activity for OER. EIS was used to measure the charge transfer resistance of electrocatalysts. So, the charge transfer resistance values were calculated by employing EIS. The EIS data were recorded as Nyquist plots using 1 M KOH as electrolyte solution at open circuit potential. The obtained results are presented in FIG. 8, which indicates that the electrocatalyst NiS-90 (806) has lower charge transfer resistance compared to other electrocatalysts, NiS-30 (802), NiS-60 (804), and NiS-120 (808) which further confirms its enhanced electrocatalytic activity for OER.

The OER parameters of the NiS-90 catalyst were compared to the reported data for various nickel sulfide phases fabricated from different processes, as shown in Table 1. The activity of the NiS catalyst prepared by AACVD is better than that mentioned in Table 1.

TABLE 1

Comparison of OER parameters of NiS catalysts produced from different fabrication methods.

| Catalyst material | Synthesis route | Overpotential (mV) @ 10 mA cm$^{-2}$ |
|---|---|---|
| $Ni_2S_3$ | Thermal sulfurization | 256 |
| NiS | Sulfurization | 335 |
| $Ni_3S_2$ | Hydrothermal | 344 |
| NiS | Polyol solution method | 375 |
| $Ni_3S_2$ | | 295 |
| $NiS_2$ | | 375 |
| $Ni_3S_2$/NiFe layer double hydroxide | Electrodeposited | 200 |
| Ni/NiS//N-doped carbon | High-temperature treatment | 337 |
| $IrO_2$ | Commercially available | 301 |
| $RuO_2$ | Commercially available | 322 |
| NiS-90* | AACVD | 210 |

*refers to the catalyst prepared by the method of the present disclosure

Figure 9A:
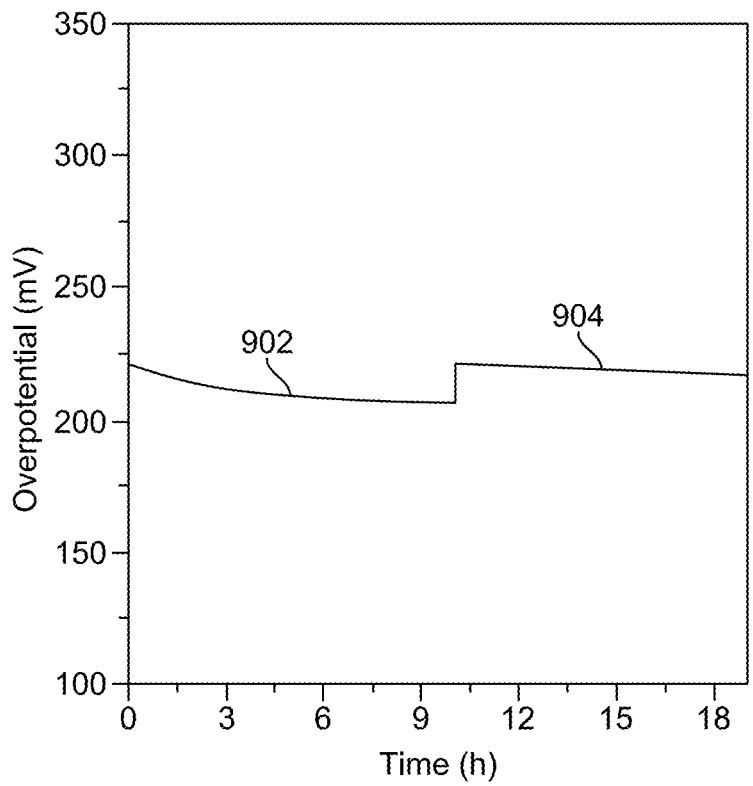
FIG. 9A shows a chronopotentiometry response of the NiS-90 catalyst in 1.0 M KOH electrolyte solution, according to certain embodiments.
Figure 9B:
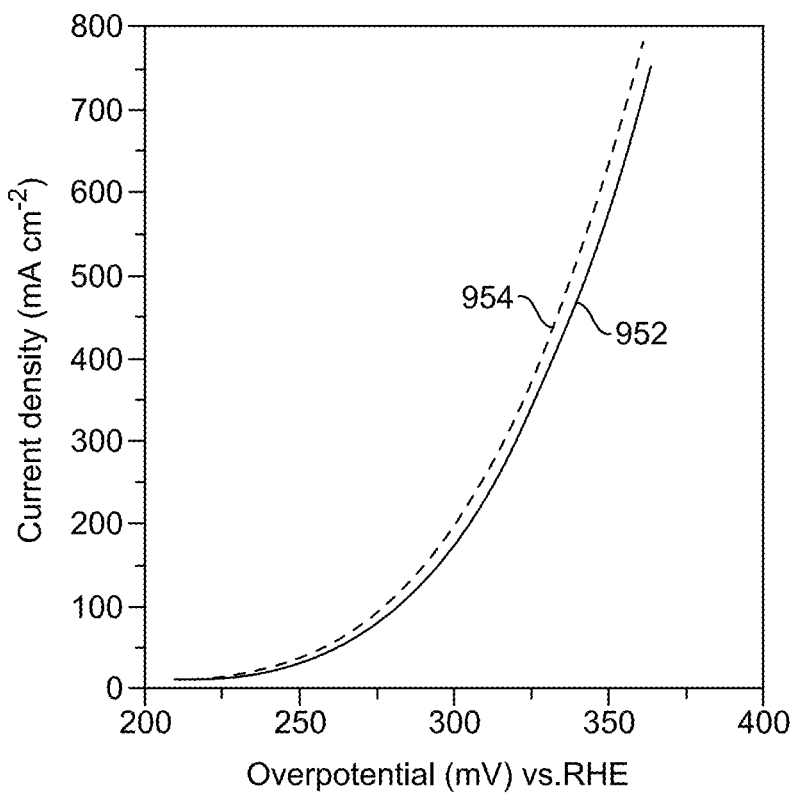
FIG. 9B shows linear sweep voltammetry (LSV) polarization curves of the NiS-90 catalyst before and after a stability test, according to certain embodiments.

The electrocatalytic stability of the NiS-90 electrode was also examined by galvanostatic chronopotentiometry measurements at two different applied current densities of 10 mA cm$^{-2}$ (902) and 20 mA cm$^{-2}$ (904), respectively. The resulting chronopotentiometry profile is shown in FIG. 9A revealed that the electrochemically oxidized Ni-sulfide catalyst was largely stable during the 19 hours of the chronopotentiometry experiment. The η10 value at 10 mA cm$^{-2}$ improved from 228 mV to 205 mV by the first 10 h. When switching the current density from 10 to 20 mA cm$^{-2}$, a small increase in the η10 value from 205 to 221 mV was observed. The η120 value at 20 mA cm$^{-2}$ hardly fluctuated and remained constant between 221 mV and 216 mV in the last 9 h. The result shows that the overvoltage values remain almost constant with two different applied current densities. During the long-term stability test, no signs of deterioration or delamination of the film electrode were observed. After a chronopotentiometry experiment, the polarization curve of the same electrode was recorded and compared with its initial behavior. As shown in FIG. 9B, the current density of the NiS electrode was slightly increased after the stability (952) in comparison to the current density before the stability test (954). The small increment in current density was attributed to the reconstruction of the catalyst structure during the long-term stability test. The turnover frequency (TOF, per catalyst site) was estimated using the equation [TOF=I/(4×F×m)] where I, F, and m are the current, Faraday's constant (96485 C/mol), and a number of moles of active material (catalyst) that is deposited on the electrode, respectively. The TOF at overpotentials of 210 mV and 340 mV was calculated for the NiS-90 electrocatalyst, and its values were found to be 0.01 s$^{-1}$ and 0.39 s$^{-1}$, respectively, which was comparable to the literature values.

Figure 10A:
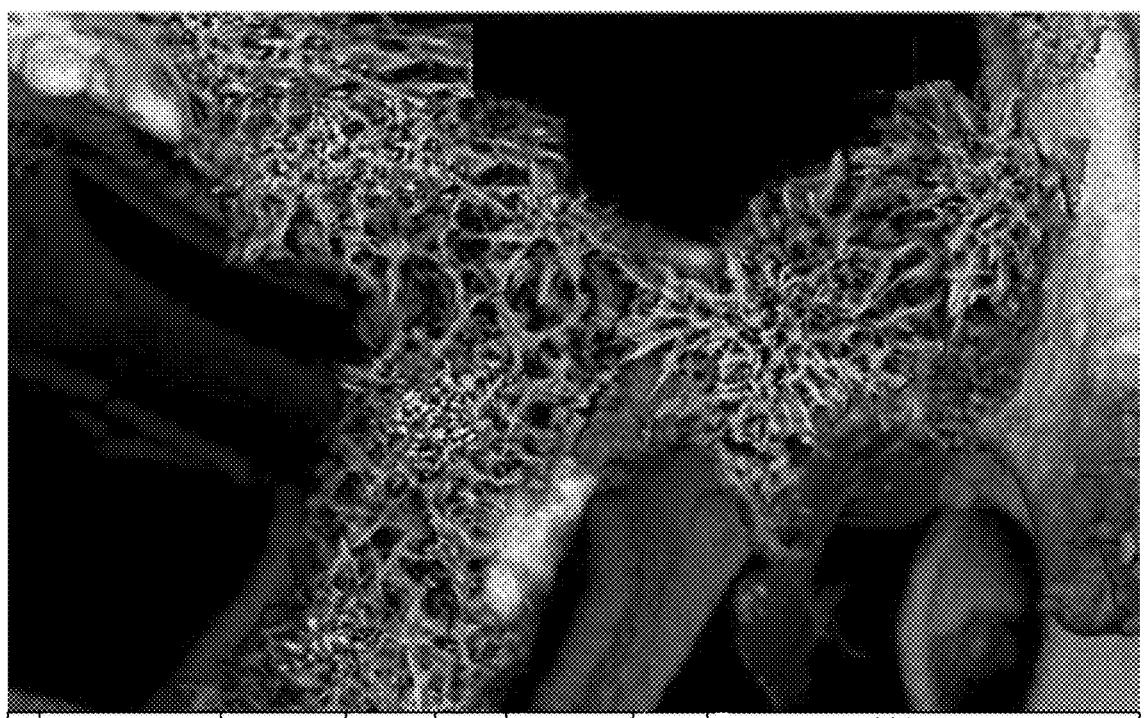
FIGS. 10A and 10B show low-magnification FESEM images of used NiS-90 catalyst taken at different places, according to certain embodiments.
Figure 10B:
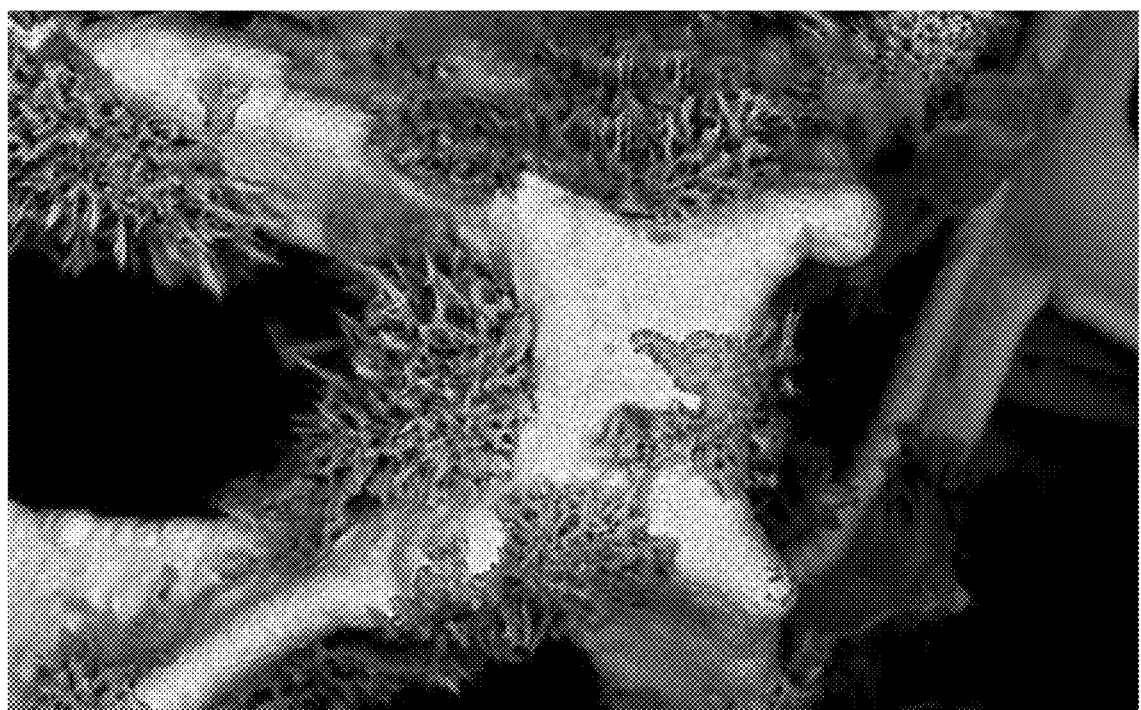
Figure 11A:
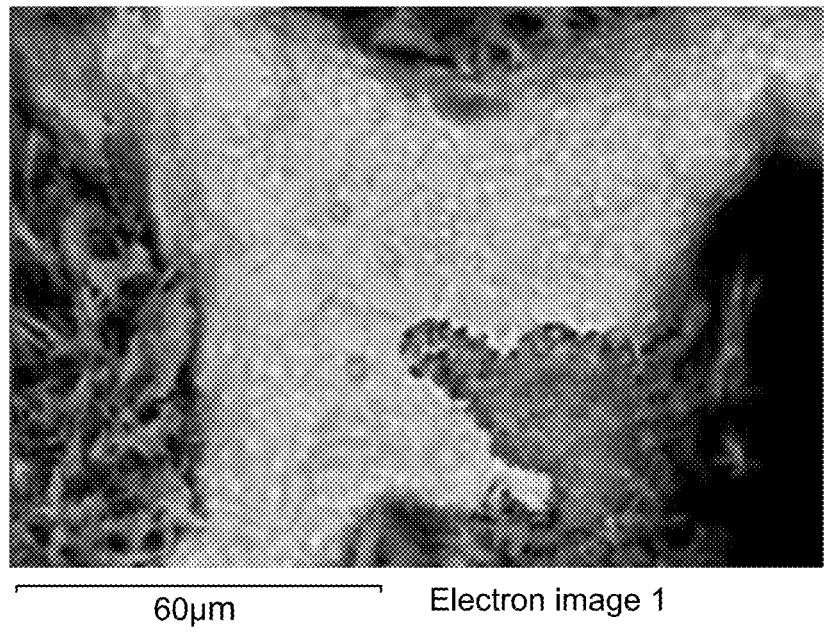
FIGS. 11A and 11B show EDX spectra of the used NiS-90 catalyst analyzed at two different surfaces, according to certain embodiments.
Figure 11B:
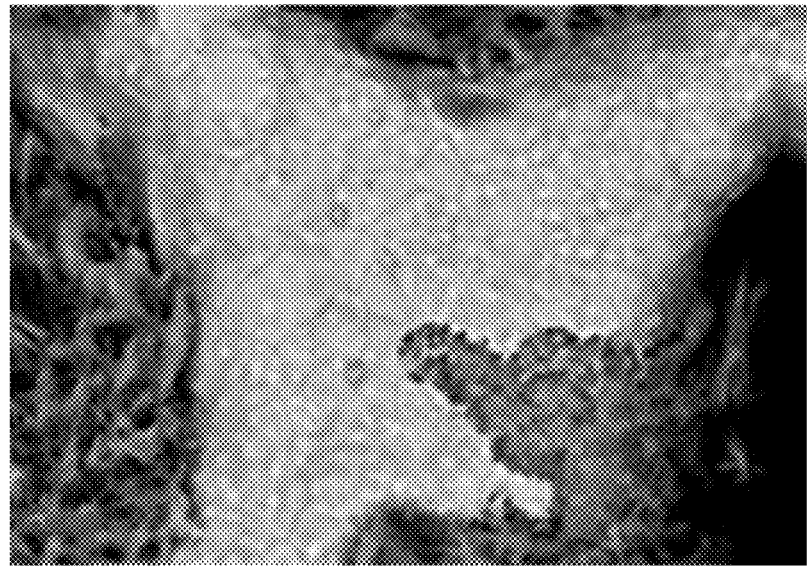
Figure 11C:
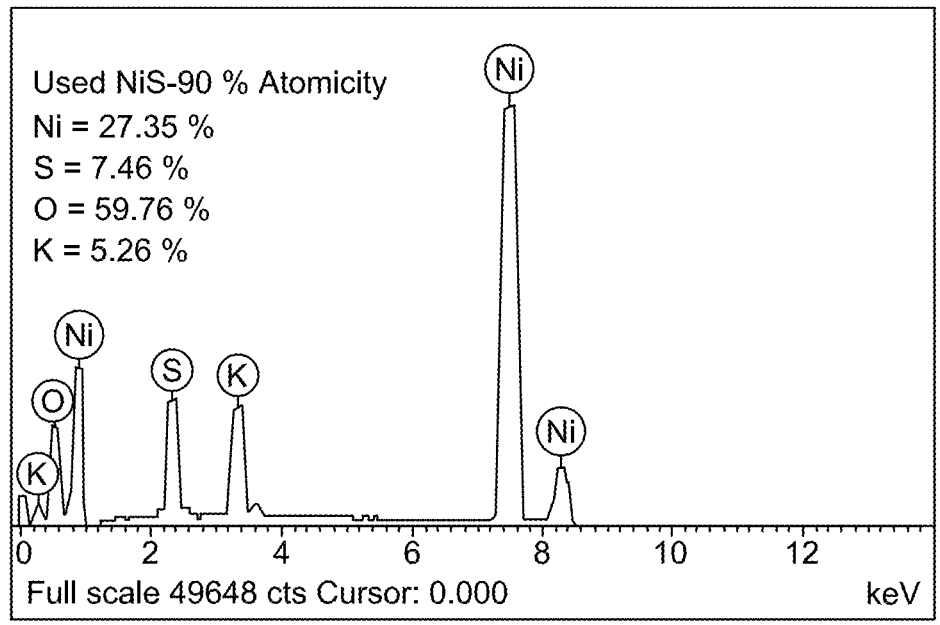
FIGS. 11C and 11D show EDX spectra of single-phase NiS-90 samples with the measured % atomic concentration of Ni, O, S, and K atoms according to certain embodiments.
Figure 11D:
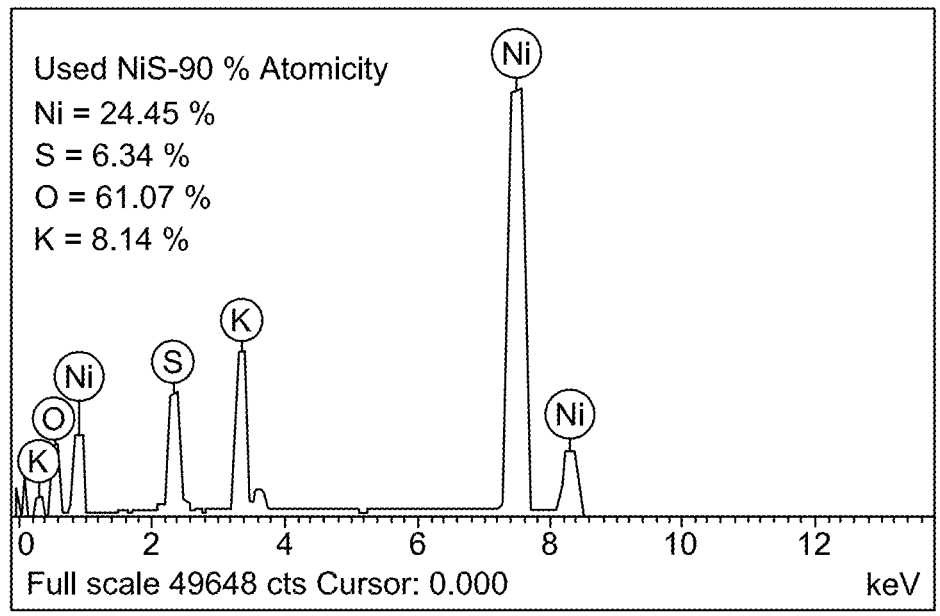
Figure 11E:
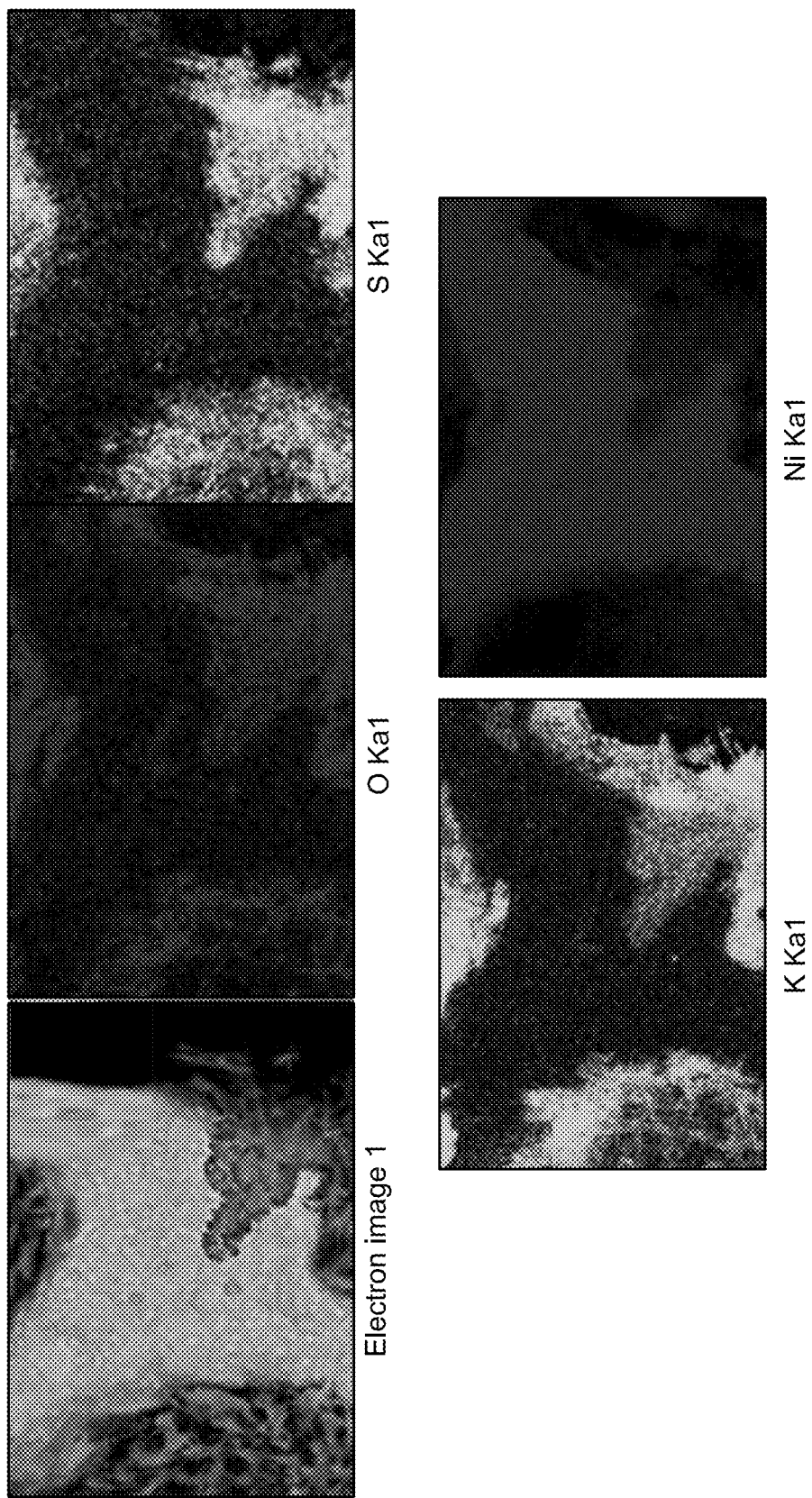
FIG. 11E shows an EDX map analysis indicating the homogenous distribution of Ni, O, S, and K atoms on the surface of the used NiS-90 catalyst, according to certain embodiments.

The surface of the used NiS-90 catalyst was re-examined by FESEM and EDX analyses to observe any morphological and compositional changes induced by the prolonged electrochemical treatment. FIGS. 10A and 10B show the FESEM images of the used NiS-90 catalyst on different surfaces. It can be observed that the catalyst retained its spike and thorn-like microstructure as observed in its fresh form (FIG. 3C). In some spots, the spiky structure was not visible due to the build-up of the electrolyte (KOH) mass. The elemental composition of the Ni, S, O, and K atoms on the surface of the used NiS-90 catalyst was also determined. FIGS. 11A-11D. FIGS. 11A and 11B show EDX spectra of the used NiS-90 catalyst analyzed at two different surfaces with their respective elemental compositions. FIGS. 11C and 11D show EDX map analysis indicating the homogenous distribution of Ni, O, S, and K atoms on the surface of the used NiS-90 catalyst. The used NiS-90 catalyst has significantly reduced S content compared to its unused form (FIG. 4C). While the O contents were completely absent on the surface of the fresh catalyst, they increased significantly in the used catalyst. In addition, an EDX map analysis was performed to identify the positions of the S and O atoms, and a homogenous distribution of both elements was analyzed using the EDX map images (FIG. 11E). The presence of S together with O atoms shows that the NiS catalyst was partially oxidized during the electrochemical OER process instead of completely removing the sulfide ions from the catalyst surface, which resulted in a complete conversion of NiS to amorphous NiO.

Figure 12:
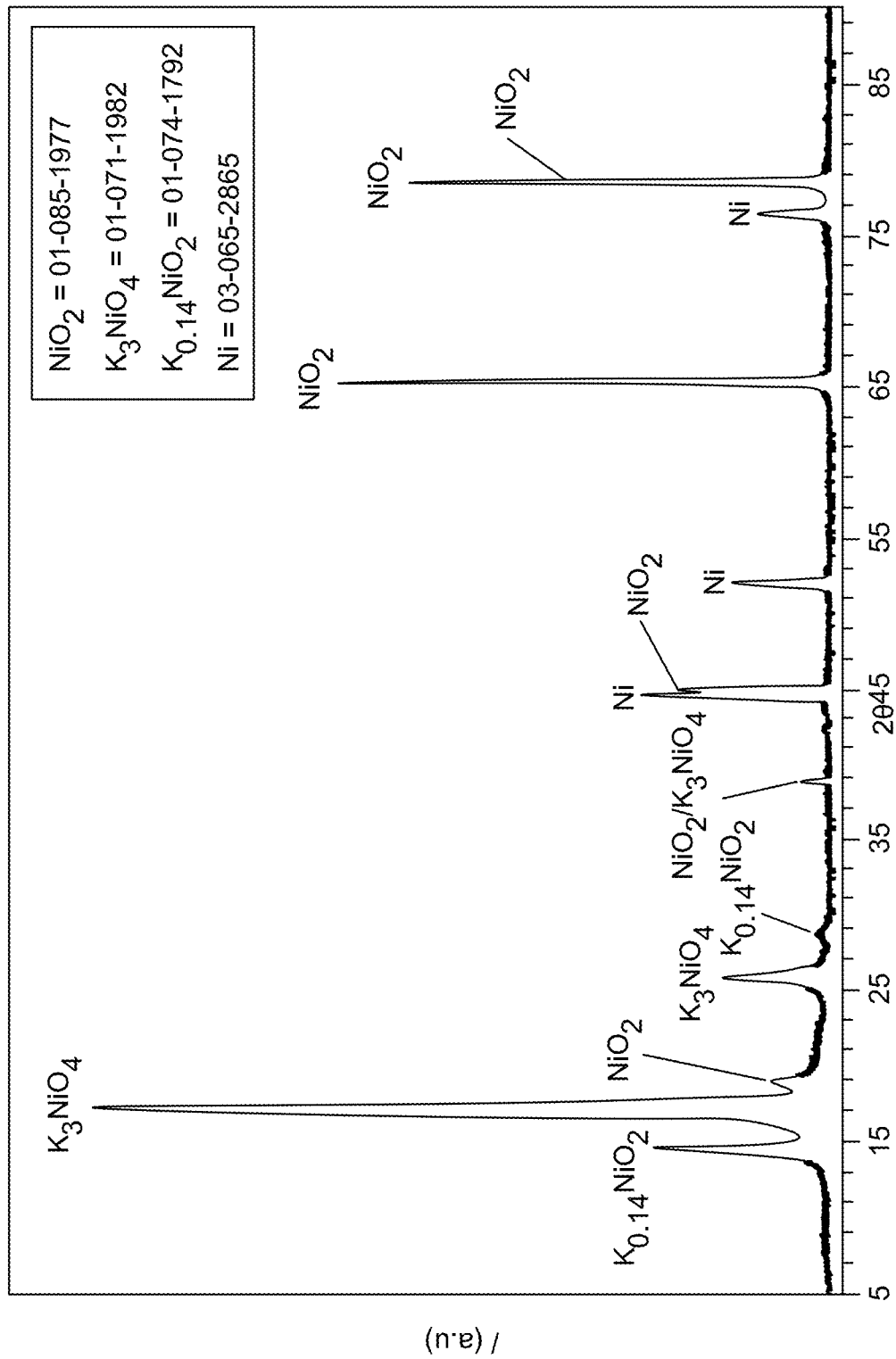
FIG. 12 shows the XRD pattern of the used NiS-90 catalyst after performing electrochemical water oxidation in 1 M KOH electrolyte, according to certain embodiments.

Further, an XRD analysis of the used NiS-90 was performed, and the results of this study are depicted in FIG. 12. From the FIG. 12 it can be observed that the XRD pattern indicates the formation of several nickel oxide phases, including "NiO$_2$", "K$_3$NiO$_4$" and "K$_{0.14}$NiO$_2$" due to electrochemical treatment. Some crystalline peaks related to metallic "Ni" appeared from the NF substrate. No peaks related to the initial "NiS" phase were identified. Based on post-characterization results (XRD and EDX), a hypothetical mechanism for water oxidation on the surface of NiS electrocatalyst was proposed. During the water oxidation process, the sulfide species leached out from the film surface, and the electrode surface was transformed into highly reactive "oxo" and "oxyhydroxide" intermediate spices as indicated by the following pathways, which include unusual and mixed valance states of nickel ions such as Ni$^\circ$, Ni$^+$, Ni$^{2+}$ and Ni$^{4+}$

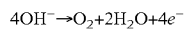
$4OH^- \rightarrow O_2 + 2H_2O + 4e^-$

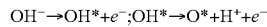
$OH^- \rightarrow OH^* + e^-; OH^* \rightarrow O^* + H^+ + e^-$

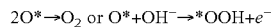
$2O^* \rightarrow O_2$ or $O^* + OH^- \rightarrow ^*OOH + e^-$

$^*OOH + OH^- \rightarrow O_2 + H_2O + e^-$

The larger the surface oxide layers on Ni—S, the more OER, and its stability was greatly facilitated. Moreover, the synergetic chemical coupling effects of different nickel oxide phases also positively contribute to the OER performance.

The deposition of NiS nanowires on the surface of NF using a simple, fast, and one-step method of AACVD was demonstrated. The various NiS catalysts, developed for 30, 60, 90, and 120 minutes (NiS-30, NiS-60, NiS-90, and NiS-120), showed great potential for OER water electrolysis in an alkaline medium. The NiS catalyst obtained after 90 min (NiS-90) of deposition exhibited relatively small overpotential values of 210 and 340 mV to approximate the characteristic current densities of 10 and 500 mA cm$^{-2}$. In addition, the NiS-90 catalyst was durable and sustainable enough to catalyze the OER for 19 hours continuously. The high OER performance of the NiS-90 NiS catalyst was related to the partial conversion of NiS to nickel oxide during the electrochemical activation process. The electrochemical and structural characterization suggested that S atoms near the surface of NiS acted as an activator to generate important oxidized Ni(OH)$_2$/NiOOH intermediates that promote water oxidation by providing numerous active sites and thus result in a significant improvement in OER performance. The NiS nanowires, as prepared by the method of the present disclosure, can be considered promising electrode materials for several other applications such as batteries, supercapacitors, fuel cells, etc.

Obviously, numerous modifications and variations of the present disclosure are possible in light of the above teachings. It is therefore to be understood that within the scope of the appended claims, the invention may be practiced otherwise than as specifically described herein.

The invention claimed is:

1. An aerosol-assisted chemical vapor-deposition (AACVD) method, comprising:
aerosol-assisted chemical vapor-depositing a nickel carbamate compound to form nickel sulfide (NiS) nanowires on a conductive support, wherein the NiS nanowires are in a form of monocrystalline NiS in a hexagonal phase;
wherein:
the NiS nanowires comprise a microstructure present directly on a surface of the conductive support, the microstructure comprising a nanocrystalline morphology that protrudes across the surface of the conductive support, and
a mass density of the NiS nanowires on the conductive support is from greater than 0.18 to less than 0.45 mg/cm$^2$.

2. The method of claim 1, wherein the conductive support is a nickel foam, graphene, or a carbon cloth.

3. The method of claim 1, wherein the nickel carbamate compound is aerosol-assisted chemical vapor-deposited for an interval of from 30 to 120 minutes to form nanowires having a length in a longest dimension of from 10 μm to 100 μm.

4. The method of claim 1, wherein the nickel carbamate compound is a single source precursor (SSP) for the NiS nanowires.

5. The method of claim 1, wherein during the aerosol-assisted chemical vapor-depositing, the nickel carbamate compound decomposes to form nickel (Ni) and sulfur(S) atoms simultaneously.

6. The method of claim 1, further comprising:
exposing the NiS nanowires present on the surface of the conductive support to an alkaline aqueous solution to form oxygen and hydrogen.

7. The method of claim 6, wherein the alkaline aqueous solution is potassium hydroxide (KOH).

8. The method of claim 5, wherein:
the S atoms present on the surface of the conductive support generate an oxidized Ni(OH)$_2$NiOOH intermediate to promote water oxidation.

9. The method of claim 1, wherein the conductive support has a length of at least 1 cm; and a width of at least 2 cm.

10. A nickel sulfide (NiS) catalyst obtained by the method of claim 1.

11. The nickel sulfide (NiS) catalyst of claim 10, wherein the conductive support is a nickel foam, graphene, or a carbon cloth.

12. A nickel sulfide (NiS) catalyst of claim 10, wherein the catalyst is formed by aerosol-assisted chemical vapor-depositing the nickel carbamate compound for an interval of from 30 to 120 minutes.

13. A nickel sulfide (NiS) catalyst of claim 10, wherein a surface of the catalyst exhibits spike and thorn-like microstructures.

14. A nickel sulfide (NiS) catalyst of claim 10, has a microstructure directly on the surface of the conductive support, wherein the microstructure comprises a nanocrystalline morphology that protrudes across the surface of the conductive support.

15. A nickel sulfide (NiS) catalyst of claim 14, wherein the microstructure has a nanocrystalline morphology that protrudes across the surface of the conductive support.

16. A nickel sulfide (NiS) catalyst of claim 15, wherein the nanocrystalline morphology has a uniform fur-rug shaped pattern.

17. The aerosol-assisted chemical vapor-deposition (AACVD) method of claim 1, wherein the conductive support comprises nickel foam having a mass of from 0.45 to 0.55 $g/cm^3$.

* * * * *